United States Patent
Du et al.

(10) Patent No.: US 12,213,362 B2
(45) Date of Patent: Jan. 28, 2025

(54) DISPLAY SUBSTRATE, MANUFACTURING METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Benlian Wang, Beijing (CN); Yuanjie Xu, Beijing (CN); Yue Long, Beijing (CN); Yao Huang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/504,175

(22) Filed: Nov. 8, 2023

(65) Prior Publication Data

US 2024/0081115 A1    Mar. 7, 2024

Related U.S. Application Data

(63) Continuation of application No. 17/418,784, filed as application No. PCT/CN2020/129663 on Nov. 18, 2020, now Pat. No. 12,075,667.

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC .......... H10K 59/1213; H10K 59/1216; H10K 59/124; H10K 59/131
See application file for complete search history.

(56) References Cited

U.S. PATENT DOCUMENTS

| 2007/0046193 A1 | 3/2007 | Rhee et al. |
| 2008/0116457 A1 | 5/2008 | Park et al. |

(Continued)

FOREIGN PATENT DOCUMENTS

| CN | 103456765 A | 12/2013 |
| CN | 104637437 A | 5/2015 |

(Continued)

OTHER PUBLICATIONS

International Search Report for PCT/CN2020/129663 Mailed May 28, 2021.

*Primary Examiner* — Daniel P Shook
(74) *Attorney, Agent, or Firm* — Ling Wu; Stephen Yang; Ling and Yang Intellectual Property

(57) ABSTRACT

A display substrate. In a plane parallel to the display substrate, the display substrate includes a plurality of sub-pixels, at least one sub-pixel includes a pixel driving circuit and a light emitting device connected to the pixel driving circuit, the pixel driving circuit at least includes a storage capacitor and a plurality of transistors, the plurality of transistors at least includes a driving transistor and at least one switching transistor of a dual-gate structure. In a plane perpendicular to the display substrate, the display substrate includes a plurality of conductive layers, the first polar plate and the gate electrode of the drive transistor are arranged in the same layer, the second polar plate and the first power line are arranged in the same layer.

8 Claims, 19 Drawing Sheets

(51) Int. Cl.
  *H10K 59/121* (2023.01)
  *H10K 59/124* (2023.01)
  *H10K 71/00* (2023.01)
(52) U.S. Cl.
  CPC ......... *H10K 71/00* (2023.02); *H10K 59/1201* (2023.02); *H10K 59/124* (2023.02)

(56) References Cited

U.S. PATENT DOCUMENTS

| | | | |
|---|---|---|---|
| 2014/0332768 A1* | 11/2014 | Kwon | H10K 59/121 257/40 |
| 2015/0069335 A1 | 3/2015 | Hsu | |
| 2015/0130691 A1 | 5/2015 | Jeon | |
| 2016/0307929 A1 | 10/2016 | Zhang | |
| 2018/0286314 A1 | 10/2018 | Cho et al. | |
| 2019/0206971 A1 | 7/2019 | Kim et al. | |

FOREIGN PATENT DOCUMENTS

| | | |
|---|---|---|
| CN | 104659285 A | 5/2015 |
| CN | 109979970 A | 7/2019 |

* cited by examiner

DISPLAY SUBSTRATE, MANUFACTURING METHOD THEREOF, AND DISPLAY DEVICE

CROSS-REFERENCE TO RELATED APPLICATIONS

This application is a continuation of U.S. patent application Ser. No. 17/418,784 filed on Jun. 26, 2021, which is a U.S. National Phase Application under 35 U.S.C. § 371 of International Application No. PCT/CN2020/129663 filed on Nov. 18, 2020. The above-identified applications are incorporated herein by reference in their entireties.

TECHNICAL FIELD

The present disclosure relates to the field of display technology, and more particularly, to a display substrate, a manufacturing method thereof and a display device.

BACKGROUND

Organic light emitting diodes (OLEDs) are active light emitting display devices having advantages such as self-light emitting, wide viewing angle, high contrast, low power consumption, extremely high response speed, lightness and thinness, bendability, low cost, etc. With the continuous development of the display technology, flexible display devices using OLEDs as light emitting devices and control signals by film transistors (TFTs) have become mainstream products in the current display field.

SUMMARY

A summary of the subject matter described in detail in the present disclosure will be provided below. The summary is not intended to limit the protection scope of the claims.

The present application provides a display substrate. In a plane parallel to the display substrate, the display substrate includes a plurality of sub-pixels, at least one sub-pixel includes a pixel driving circuit and a light emitting device connected to the pixel driving circuit, the pixel driving circuit at least includes a storage capacitor and a plurality of transistors, the plurality of transistors at least includes a driving transistor and at least one switching transistor of a dual-gate structure, the storage capacitor includes a first polar plate and a second polar plate, the first plate is connected to a gate electrode of the driving transistor, the second polar plate is connected to a first power line, and the light emitting device at least includes an anode.

In a plane perpendicular to the display substrate, the display substrate includes a plurality of conductive layers, the first polar plate and the gate electrode of the drive transistor are arranged in the same layer, the second polar plate and the first power line are arranged in the same layer, an orthogonal projection of the anode on the plane of the display substrate at least partially overlaps an orthogonal projection of the driving transistor on the plane of the display substrate, and two channels of the switching transistor of the dual-gate structure extend along a pixel row direction.

In an exemplary embodiment, the plurality of transistors at least includes a first transistor, a second transistor, a third transistor, a fourth transistor, a fifth transistor, a sixth transistor, and a seventh transistor, the switching transistor of the dual-gate structure is the first transistor, and the driving transistor is the third transistor.

A gate electrode of the first transistor is connected to a second scanning signal line, a first electrode of the first transistor is connected to an initial signal line, a second electrode of the first transistor is connected to a first electrode of the second transistor.

A gate electrode of the second transistor is connected to a first scanning signal line, and a second electrode of the second transistor is connected to a second electrode of the third transistor.

A first electrode of the third transistor is connected to a second electrode of the fourth transistor and a second electrode of the fifth transistor.

A gate electrode of the fourth transistor is connected to the first scanning signal line, and a first electrode of the fourth transistor is connected with a data signal line.

A gate electrode of the fifth transistor is connected to a light emitting control line, and a first electrode of the fifth transistor is connected with the first power line.

A gate electrode of the sixth transistor is connected to the light emitting control line, a first electrode of the sixth transistor is connected to the second electrode of the third transistor, and a second electrode of the sixth transistor is connected with the anode of the light emitting device.

A gate electrode of the seventh transistor is connected to the first scanning signal line, a first electrode of the seventh transistor is connected to the initial signal line, and a second electrode of the seventh transistor is connected to the anode of the light emitting device.

In an exemplary embodiment, in the plane perpendicular to the display substrate, the display substrate further includes a semiconductor layer disposed on a base, and active layers of the first transistor to the seventh transistor are arranged in the semiconductor layer; the semiconductor layer includes a first active layer of the first transistor, a second active layer of the second transistor, a third active layer of the third transistor, a fourth active layer of the fourth transistor, a fifth active layer of the fifth transistor, a sixth active layer of the sixth transistor and a seventh active layer of the seventh transistor; and a second region of the first active layer and a first region of the second active layer are connected to each other, a second region of the second active layer and a second region of the third active layer are connected to each other, a first region of the third active layer and a second region of the fourth active layer are connected to each other, a second region of the sixth active layer and a second region of the seventh active layer are connected to each other.

In an exemplary embodiment, an area in which the first scanning signal line overlaps with the second active layer serves as the gate electrode of the second transistor of the dual-gate structure, an area in which the first scanning signal line overlaps with the fourth active layer serves as the gate electrode of the fourth transistor, an area in which the second scanning signal line overlaps with the first active layer serves as the gate electrode of the first transistor of dual-gate structure, an area in which the second scanning signal line overlaps with the seventh active layer serves as the gate electrode of the seventh transistor, an area in which the light emitting control line overlaps with the fifth active layer serves as the gate electrode of the fifth transistor, and an area in which the light emitting control line overlaps with the sixth active layer serves as the gate electrode of the sixth transistor.

In an exemplary embodiment, the first power line is connected to a first region of the fifth active layer through an eighth via hole, the data signal line is connected to a first region of the fourth active layer through a ninth via hole, and the initial signal line is connected to a first region of the first active layer and a first region of the seventh active layer through a tenth via hole and a twelfth via hole.

The present disclosure further provides a display device including the display substrate described above.

The present disclosure further provides a method for manufacturing a display substrate, wherein in a plane parallel to the display substrate, the display substrate includes a plurality of sub-pixels, at least one sub-pixel includes a pixel driving circuit and a light emitting device connected to the pixel driving circuit, the pixel driving circuit at least includes a storage capacitor and a plurality of transistors, the plurality of transistors at least includes a driving transistor and at least one switching transistor of a dual-gate structure, the storage capacitor includes a first polar plate and a second polar plate, the first plate is connected to a gate electrode of the driving transistor, the second polar plate is connected to a first power line, the light emitting device at least includes an anode; the method includes: forming a plurality of conductive layers.

The first polar plate and the gate electrode of the drive transistor are arranged in the same layer, the second polar plate and the first power line are arranged in the same layer, an orthogonal projection of the anode on the plane of the display substrate at least partially overlaps an orthogonal projection of the driving transistor on the plane of the display substrate, and two channels of the switching transistor of the dual-gate structure extend along a pixel row direction.

In an exemplary embodiment, the plurality of transistors at least includes a first transistor, a second transistor, a third transistor, a fourth transistor, a fifth transistor, a sixth transistor, and a seventh transistor, the switching transistor of the dual-gate structure is the first transistor, and the driving transistor is the third transistor.

A gate electrode of the first transistor is connected to a second scanning signal line, a first electrode of the first transistor is connected to an initial signal line, a second electrode of the first transistor is connected to a first electrode of the second transistor and a gate electrode of the third transistor.

A gate electrode of the second transistor is connected to a first scanning signal line, a second electrode of the second transistor is connected to a second electrode of the third transistor.

A first electrode of the third transistor is connected to a second electrode of the fourth transistor and a second electrode of the fifth transistor.

A gate electrode of the fourth transistor is connected to the first scanning signal line, and a first electrode of the fourth transistor is connected with a data signal line.

A gate electrode of the fifth transistor is connected to a light emitting control line, and a first electrode of the fifth transistor is connected with the first power line.

A gate electrode of the sixth transistor is connected to the light emitting control line, a first electrode of the sixth transistor is connected to the second electrode of the third transistor, and a second electrode of the sixth transistor is connected with the anode of the light emitting device.

A gate electrode of the seventh transistor is connected to the first scanning signal line, a first electrode of the seventh transistor is connected to the initial signal line, and a second electrode of the seventh transistor is connected to the anode of the light emitting device.

Other aspects may become apparent upon reading and understanding the accompanying drawings and the detailed description.

BRIEF DESCRIPTION OF THE DRAWINGS

The accompanying drawings are intended to provide a further understanding of technical schemes of the present application and form a portion of the specification, and are intended to explain the technical schemes of the present application together with embodiments of the present application and not constitute a limitation to the technical schemes of the present application.

FIG. 9b is a sectional view taken along an A-A direction in FIG. 9a;

FIG. 9c is a sectional view taken along a B-B direction in FIG. 9a;

FIG. 10b is a sectional view taken along an A-A direction in FIG. 10a;

FIG. 10c is a sectional view taken along a B-B direction in FIG. 10a;

FIG. 11b is a sectional view taken along an A-A direction in FIG. 11a;

FIG. 11c is a sectional view taken along a B-B direction in FIG. 11a;

DETAILED DESCRIPTION

Figure 1:
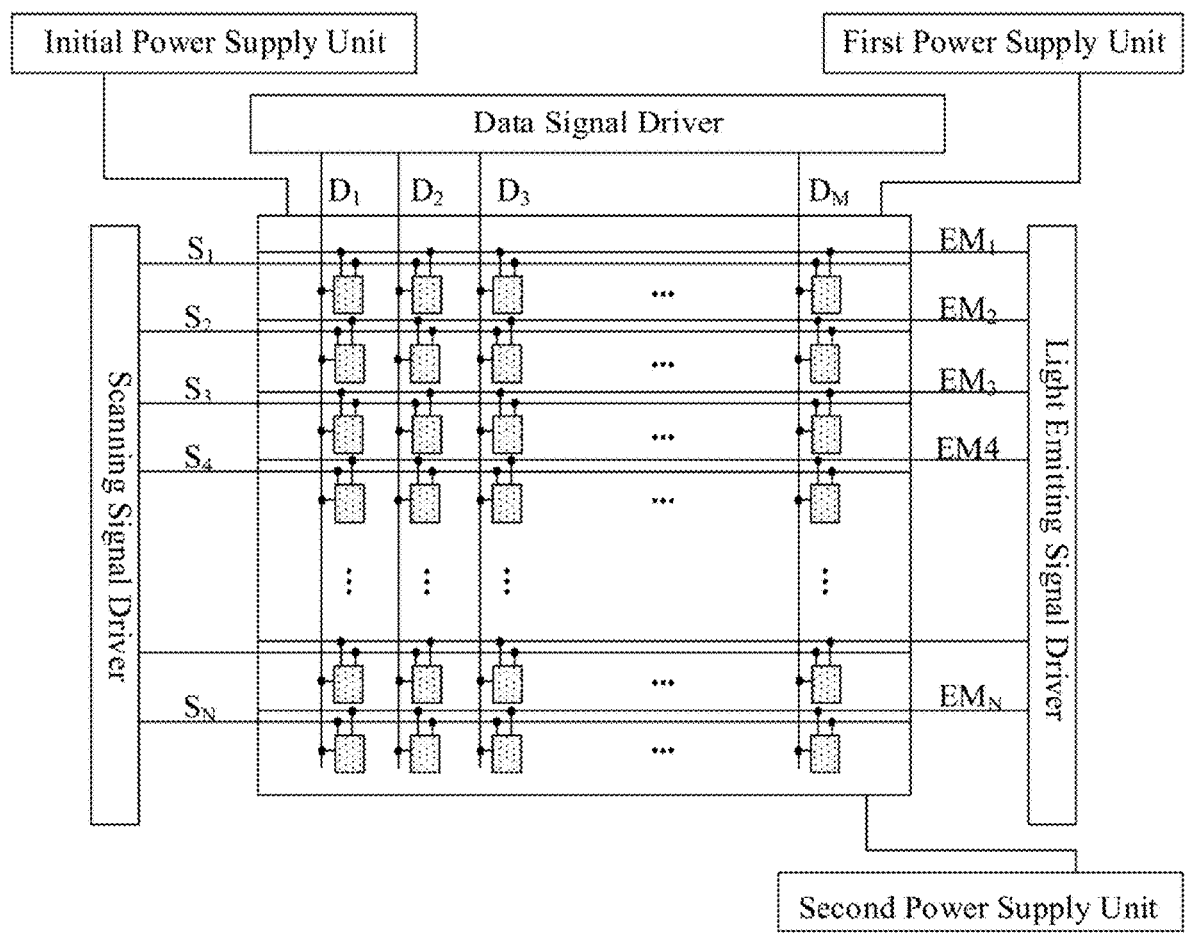
FIG. 1 is a schematic structure diagram of a display device.

In order to make objects, technical schemes and advantages of the present disclosure more clear, embodiments of the present disclosure will be described in detail below with reference to the drawings. It should be noted that the embodiments may be implemented in many different forms. Those of ordinary skills in the art may readily understand the fact that implementations and contents may be transformed into various forms without departing from the spirit and scope of the present disclosure. Therefore, the present disclosure should not be construed as being limited only to what is described in the following embodiments. The embodiments in the present disclosure and features in the embodiments may be combined randomly without conflict.

In the drawings, sizes of various constituent elements and thicknesses and areas of layers are sometimes exaggerated for sake of clarity. Therefore, an implementation of the present disclosure is not necessarily limited to the sizes shown, and shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are provided to avoid confusion between constituent elements, but not to constitute limitations on quantities.

In this specification, for sake of convenience, words such as "central", "upper", "lower", "front", "rear", "vertical", "horizontal", "top", "bottom", "inner", "outer" and the like, which are used to indicate orientational or positional relations, describe positional relationships between constituent elements with reference to the drawings, and are only for the purpose of facilitating description of this specification and simplifying the description, rather than indicating or implying that the mentioned device or element must have a specific orientation, or must be constructed and operated in a particular orientation, and therefore cannot be construed as limitations to the present disclosure. The positional relationships between the constituent elements are changed appropriately according to directions of various constituent elements. Therefore, the words are not limited to those described in the specification, and may be replaced appropriately according to situations.

In this specification, unless otherwise specified and defined clearly, the terms "install", "connect" and "couple" should be understood in a broad sense. For example, the connection may be a fixed connection, a detachable connection, or an integral connection; it may be a mechanical connection or an electrical connection; it may be a direct connection, an indirect connection through an intermediary, or an internal connection between two elements. Those of ordinary skills in the art can understand specific meanings of the above terms in the present disclosure according to specific situations.

In this specification, a transistor refers to an element including at least three terminals, a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. It should be noted that in this specification, the channel region refers to a region through which current mainly flows.

In this specification, the first electrode may be a drain electrode and the second electrode may be a source electrode, or the first electrode may be a source electrode and the second electrode may be a drain electrode. Functions of "the source electrode" and "the drain electrode" are sometimes interchangeable in the case where transistors with opposite polarities are used or in the case where a direction of current in circuit operation is changed. Therefore, in this specification, the "source electrode" and the "drain electrode" are interchangeable.

In this specification, an "electrical connection" includes a case where constituent elements are connected together through an element with a certain electric action. The "element with a certain electric action" is not particularly limited as long as it can carry out reception of electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a state in which an angle formed by two straight lines is above −10° and below 10°, and thus also includes a state in which the angle is above −5° and below 5°. In addition, "vertical" refers to a state in which an angle formed by two straight lines is above 80° and below 100°, and thus also includes a state in which the angle is above 85° and below 95°.

In this specification, "film" and "layer" may be interchangeable. For example, sometimes "conductive layer" may be replaced by "conductive film". Similarly, "insulating film" may sometimes be replaced by "insulating layer".

"About" in the present disclose means that bounds are not limited strictly, and values within a range of process and measurement errors are allowed.

FIG. 1 is a schematic structure diagram of a display device. As shown in FIG. 1, the OLED display device may include a scanning signal driver, a data signal driver, a light emitting signal driver, an OLED display substrate, a first power supply unit, a second power supply unit and an initial power supply unit. In an exemplary embodiment, the OLED display substrate at least includes a plurality of scanning signal lines ($S_1$ to $S_N$), a plurality of data signal lines ($D_1$ to $D_M$) and a plurality of light emitting signal lines ($EM_1$ to $EM_N$), the scanning signal driver is configured to supply scanning signals to the plurality of scanning signal lines ($S_1$ to $S_N$) in sequence, the data signal driver is configured to supply data signals to the plurality of data signal lines ($D_1$ to $D_M$) in sequence, and the light emitting signal driver is configured to supply light emitting control signals to the plurality of light emitting signal lines ($EM_1$ to $EM_N$) in sequence. In an exemplary embodiment, the plurality of scanning signal lines and the plurality of light emitting signal lines extend along a horizontal direction. The display device includes a plurality of sub-pixels, each sub-pixel includes a pixel driving circuit and a light emitting device, and the pixel driving circuit of one sub-pixel may be connected to a scanning signal line, a light emitting control line and a data signal line. The first power supply unit, the second power supply unit and the initial power supply unit are configured to supply a first supply voltage, a second supply voltage and an initial supply voltage to the pixel driving circuit through a first power line, a second power line and an initial signal line, respectively.

Figure 2:
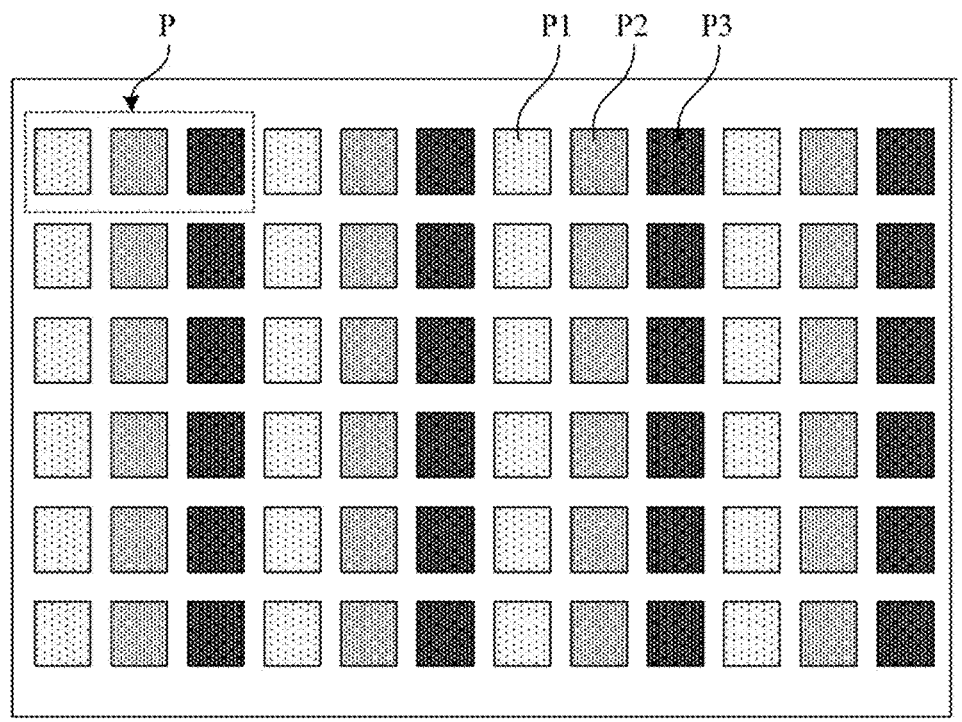
FIG. 2 is a schematic plane structure diagram of a display substrate.

FIG. 2 is a schematic plane structure diagram of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel driving circuit and a light emitting device. The pixel driving circuits in the first sub-pixel P1, the second sub-pixel P2, and the third sub-pixel P3 are connected to the scanning signal line, the data signal line and the light emitting signal line respectively. The pixel driving circuit is configured to receive a data voltage transmitted by the data signal line and output a corresponding current to the light emitting device under the control of the scanning signal line and the light emitting signal line. The light emitting device in each of the first sub-pixel P1, the second sub-pixel P2 and the third sub-pixel P3 is connected to the pixel driving circuit of the sub-pixel where the light emitting device is located. The light emitting device is configured to emit light with a corresponding luminance in response to a current output by the pixel driving circuit of the sub-pixel where the light emitting device is located.

In an exemplary embodiment, a pixel unit P may include red (R), green (G) and blue (B) sub-pixels, or may include red, green, blue and white (W) sub-pixels, which is not limited in the present disclosure. In an exemplary embodiment, shapes of the sub-pixels in the pixel units may be rectangular, diamond, pentagonal or hexagonal. When the pixel unit includes three sub-pixels, the three sub-pixels may be arranged side by side horizontally, side by side vertically, or in a pyramid shape; when the pixel unit includes four sub-pixels, the four sub-pixels may be arranged side by side horizontally, side by side vertically, or in a square shape, which is not specifically limited in the present disclosure.

Figure 3:
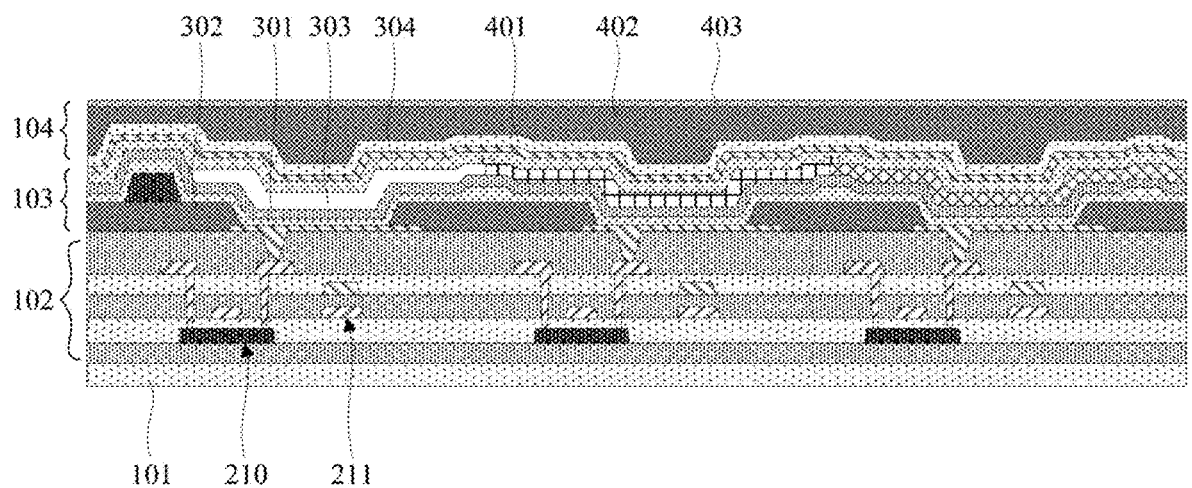
FIG. 3 is a schematic section structure diagram of a display substrate.

FIG. 3 is a schematic section structure diagram of a display substrate, which shows a structure of three sub-pixels in the OLED display substrate. As shown in FIG. 3, in a plane perpendicular to the display substrate, the display substrate may include a driving circuit layer 102 disposed on a base 101, a light emitting device 103 disposed on a side of the driving circuit layer 102 away from the base 101, and an encapsulation layer 104 disposed on a side of the light emitting device 103 away from the base 101. In some possible implementations, the display substrate may include other film layers, such as spacer posts, etc., which is not limited in the present disclosure.

In an exemplary embodiment, the driving circuit layer 102 of each sub-pixel may include a plurality of transistors and a storage capacitor constituting a pixel driving circuit. An example in which each sub-pixel includes a driving transistor and a storage capacitor is illustrated in FIG. 3. In some possible implementations, the driving circuit layer 102 of each sub-pixel may include: a first insulating layer disposed on the base; an active layer disposed on the first insulating layer; a second insulating layer covering the active layer, a gate electrode and a first polar plate arranged on the second insulating layer; a third insulating layer covering the gate electrode and the first polar plate; a second polar plate arranged on the third insulating layer, a fourth insulating layer covering the second polar plate, a via hole exposing the active layer being provided in the second, third and fourth insulating layers; a source electrode and a drain electrode arranged on the fourth insulating layer, the source electrode and the drain electrode being connected respectively to the active layer through the via hole; and a flat layer covering the aforementioned structures, a via hole exposing the drain electrode being provided in the flat layer. The active layer, the gate electrode, the source electrode and the drain electrode form the driving transistor 210, and the first polar plate and the second polar plate form the storage capacitor 211.

In an exemplary embodiment, the light emitting device 103 may include an anode 301, a pixel defining layer 302, an organic light emitting layer 303 and a cathode 304. The anode 301 is arranged on the flat layer, and is connected to the drain electrode of the driving transistor 210 through the via hole provided in the flat layer. The pixel defining layer 302 is disposed on the anode 301 and the flat layer, and a pixel opening exposing the anode 301 is provided in the pixel defining layer 302. The organic light emitting layer 303 is disposed at least partially in the pixel opening and is connected to the anode 301, and the cathode 304 is disposed on the organic light emitting layer 303 and is connected to the organic light emitting layer 303. The organic light emitting layer 303 emits light of a corresponding color under the driving of the anode 301 and the cathode 304.

In an exemplary embodiment, the encapsulation layer 104 may include a first encapsulation layer 401, a second encapsulation layer 402 and a third encapsulation layer 403 which are stacked. The first encapsulation layer 401 and the third encapsulation layer 403 may be made of inorganic materials, and the second encapsulation layer 402 may be made of organic materials. The second encapsulation layer 402 is disposed between the first encapsulation layer 401 and the third encapsulation layer 403 to ensure that external water vapor cannot enter the light emitting device 103.

In an exemplary embodiment, the organic light emitting layer 303 may at least include a hole injection layer, a hole transport layer, a light emitting layer and a hole blocking layer which are stacked on the anode 301. In an exemplary embodiment, hole injection layers of all sub-pixels are common layers connected together, hole transport layers of all sub-pixels are common layers connected together, light emitting layers of adjacent sub-pixels may overlap with each other slightly or may be separate, and hole blocking layers are common layers connected together.

Figure 4:
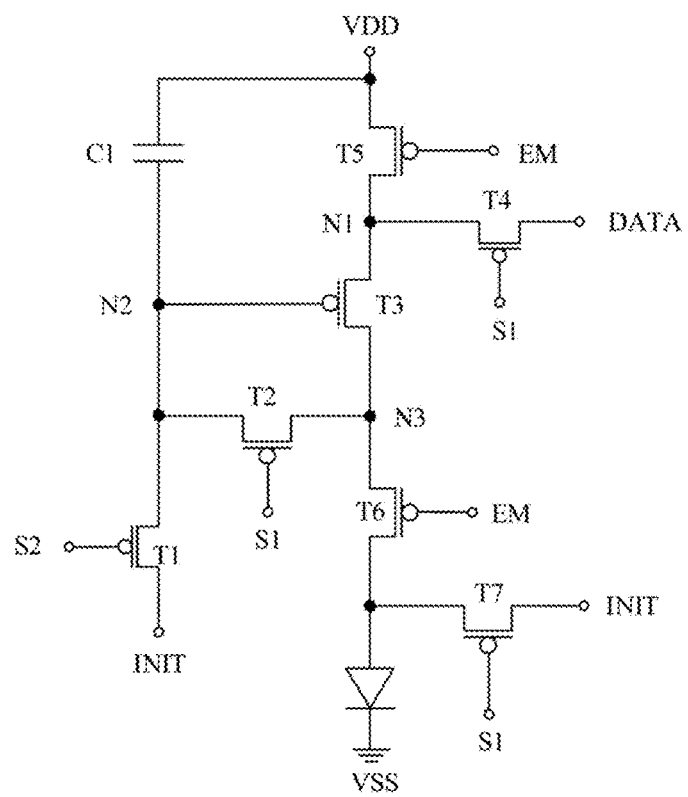
FIG. 4 is a schematic equivalent circuit diagram of a pixel driving circuit.

In an exemplary embodiment, the pixel driving circuit may be a structure of 3T1C, 4T1C, 5T1C, 5T2C, 6T1C or 7T1C. FIG. 4 is a schematic equivalent circuit diagram of a pixel driving circuit. As shown in FIG. 4, the pixel driving circuit may include seven switching transistors (a first transistor T1 to a seventh transistor T7), one storage capacitor C and seven signal lines (a data signal line DATA, a first scanning signal line S1, a second scanning signal line S2, an initial signal line INIT, a first power line VDD, a second power line VSS and a light emitting signal line EM).

In an exemplary embodiment, a gate electrode of the first transistor T1 is connected to the second scanning signal line S2, a first electrode of the first transistor T1 is connected to the initial signal line INIT, and a second electrode of the first transistor is connected to a second node N2. A gate electrode of the second transistor T2 is connected to the first scanning signal line S1, a first electrode of the second transistor T2 is connected to the second node N2, and a second electrode of the second transistor T2 is connected to a third node N3. A gate electrode of the third transistor T3 is connected to the second node N2, a first electrode of the third transistor T3 is connected to a first node N1, and a second electrode of the third transistor T3 is connected to the third node N3. A gate electrode of the fourth transistor T4 is connected to the first scanning signal line S1, a first electrode of the fourth transistor T4 is connected to the data signal line DATA, and a second electrode of the fourth transistor T4 is connected to the first node N1. A gate electrode of the fifth transistor T5 is connected to the light emitting signal line EM, a first electrode of the fifth transistor T5 is connected to the first power line VDD, and a second electrode of the fifth transistor T5 is connected to the first node N1. A gate electrode of the sixth transistor T6 is connected to the light emitting signal line EM, a first electrode of the sixth transistor T6 is connected to the third node N3, and a second electrode of the sixth transistor T6 is connected to a first electrode of the light emitting device. A gate electrode of the seventh transistor T7 is connected to the first scanning signal line S1, a first electrode of the seventh transistor T7 is connected to the initial signal line INIT, and a second electrode of the seventh transistor T7 is connected to the first electrode of the light emitting device. A first end of the storage capacitor C is connected to the first power line VDD, and a second end of the storage capacitor C is connected to the second node N2.

In an exemplary embodiment, the first transistor T1 to the seventh transistor T7 may be P-type transistors or may be N-type transistors. Using the same type of transistors in the pixel driving circuit may simplify a process flow, reduce process difficulties of a display panel, and improve product yield. In some possible implementations, the first transistor T1 to the seventh transistor T7 may include P-type transistors and N-type transistors.

In an exemplary embodiment, a second electrode of the light emitting device is connected to the second power line VSS, signals of the second power line VSS are low level signals, and signals of the first power line VDD are high level signals that are continuously supplied. The first scanning signal line S1 is a scanning signal line in a pixel driving circuit in the present display row, and the second scanning signal line S2 is a scanning signal line in a pixel driving circuit in a previous display row, that is, for the nth display row, the first scanning signal line S1 is S(n), the second scanning signal line S2 is S(n−1), the second scanning signal line S2 in the present display row and the first scanning signal line S1 in the pixel driving circuit in the previous display row may be the same signal line, to reduce the signal lines of the display panel and implement a narrow border frame of the display panel.

In an exemplary embodiment, the first scanning signal line S1, the second scanning signal line S2, the light emitting signal line EM, the initial signal line INIT extend along the horizontal direction, and the second power line VSS, the first power line VDD and the data signal line DATA extend along the vertical direction.

In an exemplary embodiment, the light emitting device may be an organic light emitting diode (OLED) including a first electrode (an anode), an organic light emitting layer and a second electrode (a cathode) that are stacked.

Figure 5:
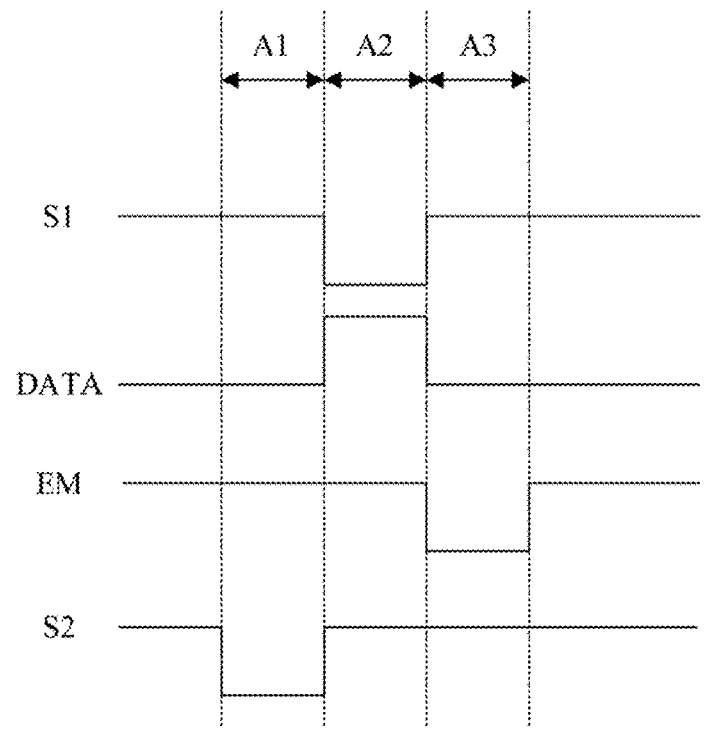
FIG. 5 is a working sequence diagram of a pixel driving circuit.

FIG. 5 is a working sequence diagram of a pixel driving circuit. An exemplary embodiment of the present disclosure will be described below through a working process of the pixel driving circuit shown in FIG. 4. The pixel driving circuit in FIG. 4 includes seven transistors (the first transistor T1 to the sixth transistor T7), a storage capacitor C and seven signal lines (the data signal line DATA, the first scanning signal line S1, the second scanning signal line S2, the initial signal line INIT, the first power line VDD, the second power line VSS and the light emitting signal line EM). The seven transistors are all P-type transistors.

In an exemplary embodiment, the working process of the pixel driving circuit may include the following stages.

In a first stage A1, which referred to as a reset stage, signals of the second scanning signal line S2 are low level signals, and signals of the first scanning signal line S1 and the light emitting signal line EM are high level signals. The signals of the second scanning signal line S2 are low level signals, to cause the first transistor T1 to be turned on, and signals of the initial signal line INIT are provided to the second node N2 to initialize the storage capacitor C, and clean up an original data voltage in the storage capacitor. The signals of the first scanning signal line S1 and the light emitting signal line EM are high level signals, to cause the second transistor T2, the fourth transistor T4, the fifth transistor T5, the sixth transistor T6 and the seventh transistor T7 to be turned off. The OLED does not emit light in this stage.

In a second stage A2, which is referred to as a data writing stage or a threshold compensation stage, the signals of the first scanning signal line S1 are low level signals, the signals of the second scanning signal line S2 and the light emitting signal line EM are high level signals, and the data signal line DATA outputs a data voltage. In this stage, because the second end of the storage capacitor C is at a low level, the third transistor T3 is turned on. The signals of the first scanning signal line S1 are low level signals, to cause the second transistor T2, the fourth transistor T4 and the seventh transistor T7 to be turned on. The second transistor T2 and the fourth transistor T4 are turned on, so that the data voltage output by the data signal line DATA is provided to the second node N2 through the first node N1, the turned-on third transistor T3, the third node N3 and the turned-on second transistor T2. Then, a difference between the data voltage output by the data signal line DATA and a threshold voltage of the third transistor T3 is charged into the storage capacitor C. A voltage at the second end (the second node N2) of the storage capacitor C is Vdata−|Vth|, Vdata being the data voltage output by the data signal line DATA and Vth being the threshold voltage of the third transistor T3. The seventh transistor T7 is turned on, so that an initial voltage of the initial signal line INIT is provided to a first electrode of the OLED to initialize (reset) the first electrode of the OLED and clean up a pre-stored internal voltage therein, thus the initialization is completed to ensure that the OLED does not emit light. The signals of the second scanning signal line S2 are high level signals, to cause the first transistor T1 to be turned off. The signals of the light emitting signal line EM are high level signals, to cause the fifth transistor T5 and the sixth transistor T6 to be turned off.

In a third stage A3, which is referred to as a light emitting stage, the signals of the light emitting signal line EM are low level signals, and the signals of the first scanning signal line S1 and the second scanning signal line S2 are high level signals. The signals of the light emitting signal line EM are low level signals, to cause the fifth transistor T5 and the sixth transistor T6 to be turned on. A supply voltage output by the first power line VDD provides a driving voltage to the first electrode of the OLED through the turned-on fifth transistor T5, third transistor T3 and sixth transistor T6, to drive the OLED to emit light.

In a driving process of the pixel driving circuit, a driving current flowing through the third transistor T3 (a driving transistor) is determined based on a voltage difference between its gate electrode and first electrode. Since a voltage of the second node N2 is Vdata−|Vth|, the driving current of the third transistor T3 is:

$$I = K^*(Vgs-Vth)^2 = K^*[(Vdd-Vdata+|Vth|)-Vth]^2 = K^*[(Vdd-Vdata]^2.$$

wherein, I is the driving current flowing through the third transistor T3, that is, a driving current that drives the OLED to emit light, K is a constant, Vgs is the voltage difference between the gate electrode and the first electrode of the third transistor T3, Vth is the threshold voltage of the third transistor T3, Vdata is the data voltage output by the data signal line DATA, and Vdd is the supply voltage output by the second power line VDD.

Figure 6:
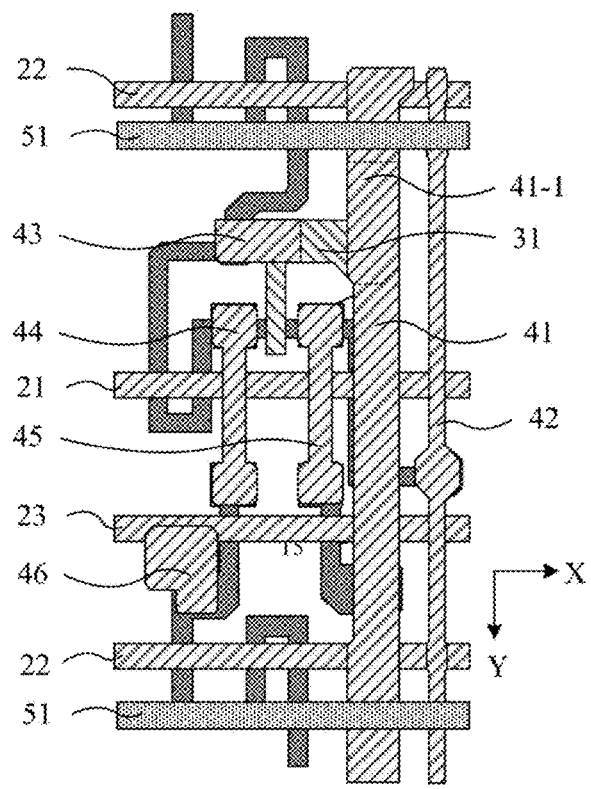
FIG. 6 is a schematic structure diagram of a display substrate according to an exemplary embodiment of the present disclosure.

FIG. 6 is a schematic structure diagram of a display substrate according to an exemplary embodiment of the present disclosure, which shows a planar structure of a sub-pixel. As shown in FIG. 6, in a plane parallel to the display substrate, a first scanning signal line 21, a second scanning signal line 22, a light emitting control line 23, an initial signal line 51, a first power line 41, a data signal line 42, a pixel driving circuit and a light emitting device are arranged in the sub-pixel of the display substrate. The pixel driving circuit may include a driving transistor, a plurality of switching transistors and a storage capacitor, each transistor includes an active layer, a gate electrode, a first electrode and a second electrode, and the storage capacitor includes a first polar plate 31 and a second polar plate 41-1.

In a plane perpendicular to the display substrate, the display substrate may include a semiconductor layer, a first conductive layer, a second conductive layer, a third conductive layer and a fourth conductive layer disposed on a base in sequence. In an exemplary embodiment, the semiconductor layer may include an active layer of a driving transistor and active layers of a plurality of switching transistors. The first conductive layer may include the first scanning signal line 21, the second scanning signal line 22, the light emitting control line 23, and the gate electrodes of a plurality of switching transistors. The second conductive layer may include the first polar plate 31 of the storage capacitor as the gate electrode of the driving transistor. The third conductive layer may include the first power line 41, the data signal line 42, a first connecting electrode 43, a second connecting electrode 44, a third connecting electrode 45 and a fourth connecting electrode 46. A portion of the first power line 41 serves as the second polar plate 41-1 of the storage capacitor. The fourth conductive layer may include the initial signal line 51 and an anode of the light emitting device.

In an exemplary embodiment, the display substrate may further include a first insulating layer, a second insulating layer, a third insulating layer, a fourth insulating layer and a fifth insulating layer. The first insulating layer is disposed between the base and the semiconductor layer, the second insulating layer is disposed between the semiconductor layer and the first conductive layer, the third insulating layer is disposed between the first and second conductive layers, the fourth insulating layer is disposed between the second and third conductive layers, and the fifth insulating layer is disposed between the third and fourth conductive layers.

In an exemplary embodiment, the first scanning signal line 21, the second scanning signal line 22, the light emitting signal line 23, the initial signal line 51 extend along the first direction X, and the first power line 41 and the data signal line 42 extend along the second direction Y.

In an exemplary embodiment, the plurality of transistors of the pixel driving circuit may include a first transistor, a second transistor, a third transistor, a fourth transistor, a fifth transistor, a sixth transistor and a seventh transistor. The third transistor is a driving transistor, and other transistors are switching transistors.

In an exemplary embodiment, the first connecting electrode 43 serves as the second electrode of the first transistor T1 and the first electrode of the second transistor T2, the second connecting electrode 44 serves as the second electrode of the second transistor T2, the second electrode of the third transistor T3 and the first electrode of the sixth transistor T6, the third connecting electrode 45 serves as the first electrode of the third transistor T3, the second electrode of the fourth transistor T4 and the second electrode of the fifth transistor T5, and the fourth connecting electrode 46 serves as the second electrode of the sixth transistor T6 and the second electrode of the seventh transistor T7.

In the display substrate provided by the exemplary embodiment of the present disclosure, by arranging the gate electrodes of the switching transistors on the first conductive layer and arranging the gate electrode of the driving transistor on the second conductive layer, not only the fast switching function of the switching transistors is ensured, but also the amplitude of the controlled gate voltage of the driving transistor is improved, thereby effectively reducing the area of the gate electrode of the driving transistor, which not only is conducive to the arrangement of layout, but also can reduce the pixel area and improve the resolution.

In an exemplary embodiment, when both the gate electrode of the switching transistor and the gate electrode of the driving transistor are arranged on the first conductive layer, the area of the gate electrode of the driving transistor is about 1 to 10 times the area of the gate electrode of the switching transistor.

A process of manufacturing the display substrate will be described below by way of example. A "patterning process" described in the present disclosure includes treatments such as photoresist coating, mask exposure, developing, etching and photoresist stripping for metal materials, inorganic materials or transparent conductive materials, and includes treatments such as organic material coating, mask exposure and developing for organic materials. Deposition may include any one or more of sputtering, vapor deposition and chemical vapor deposition, coating may include any one or more of spray coating, spin coating and ink-jet printing, and etching may include any one or more of dry etching and wet etching, which is not limited in the present disclosure. A "film" refers to a layer of film manufactured by a certain material on a base using deposition, coating or other processes. If the "film" does not need the patterning process throughout the manufacturing process, the "film" may be also called a "layer". If the "film" needs the patterning process throughout the manufacturing process, the "film" may be called a "film" before the patterning process, and is called a "layer" after the patterning process. The "layer" after the patterning process contains at least one "pattern". "A and B are disposed on a same layer" described in the present disclosure means that A and B are formed at the same time by the same patterning process, and the "thickness" of a film layer is a dimension of the film layer in a direction perpendicular to the display substrate. In an exemplary embodiment of the present disclosure, "an orthographic projection of B being located within a range of an orthographic projection of A" means that a boundary of the orthographic projection of B falls within the range of the boundary of the orthographic projection of A, or the boundary of the orthographic projection of A overlaps with the boundary of the orthographic projection of B. "The orthographic projection of A containing the orthographic projection of B" means that the boundary of the orthographic projection of B falls within the range of the boundary of the orthographic projection of A, or the boundary of the orthographic projection of A overlaps with the boundary of the orthographic projection of B.

In an exemplary embodiment, the process of manufacturing the display substrate may include the following operations.

Figure 7:
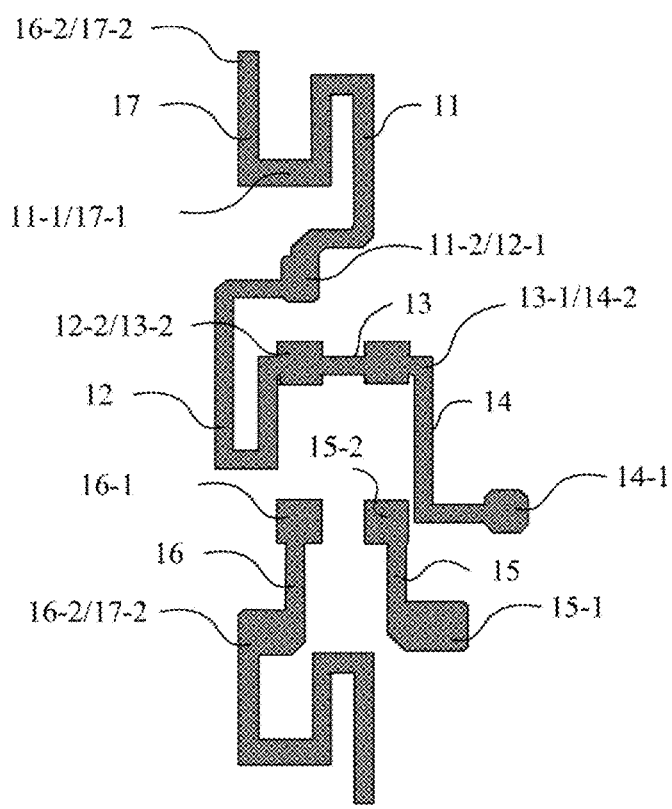
FIG. 7 is a schematic diagram of a patterned semiconductor layer according to an exemplary embodiment of the present disclosure.

(11) Patterns are formed on the semiconductor layer. In an exemplary embodiment, forming the patterns on the semiconductor layer may include: depositing a first insulating film and a semiconductor film in sequence on the base, patterning the semiconductor film through the patterning process to form the first insulating layer covering the base and the semiconductor layer disposed on the first insulating layer, as shown in FIG. 7.

In an exemplary embodiment, the semiconductor layer of at least one sub-pixel may include a first active layer of the first transistor T1 to a seventh active layer of the seventh transistor T7, the first active layer 11 of the first transistor T1, the second active layer 12 of the second transistor T2, the third active layer 13 of the third transistor T3, the fourth active layer 14 of the fourth transistor T4 and the seventh active layer 17 of the seventh transistor T7 are connected to each other to form an integral structure, and the fifth active layer 15 of the fifth transistor T5 and the sixth active layer 16 of the sixth transistor T6 are separate structures. In an exemplary embodiment, for two adjacent pixel rows, the sixth active layer 16 of the sixth transistor T6 in one sub-pixel in the previous pixel row is connected to the seventh active layer 17 of the seventh transistor T7 in the adjacent sub-pixel in the next pixel row.

In an exemplary embodiment, the first active layer 11 is n-shaped, the second active layer 12 is U-shaped, the third active layer 13 is I-shaped, the fourth active layer 14 is L-shaped, the fifth active layer 15 is L-shaped, the sixth active layer 16 is J-shaped, and the seventh active layer 17 is L-shaped.

In an exemplary embodiment, the active layer of each transistor includes a first region, a second region, and a channel region located between the first region and the second region. The first region 11-1 of the first active layer 11 serves as the first region 17-1 of the seventh active layer 17, i.e., the first region 11-1 of the first active layer 11 is connected to the first region 17-1 of the seventh active layer 17. The second region 11-2 of the first active layer 11 serves as the first region 12-1 of the second active layer 12, i.e., the second region 11-2 of the first active layer 11 is connected to the second region 12-2 of the second active layer 12. The second region 12-2 of the second active layer 12 serves as the second region 13-2 of the third active layer 13, i.e., the second region 12-2 of the second active layer 12 is connected to the second region 13-2 of the third active layer 13. The first region 13-1 of the third active layer 13 serves as the second region 14-2 of the fourth active layer 14, i.e., the first region 13-1 of the third active layer 13 is connected to the second region 14-2 of the fourth active layer 14. The second region 16-2 of the sixth active layer 16 serves as the second region 17-2 of the seventh active layer 17, i.e., the second region 16-2 of the sixth active layer 16 is connected to the second region 17-2 of the seventh active layer 17. The first region 14-1 of the fourth active layer 14, the first region 15-1 of the fifth active layer 15 and the second region 15-2 of the fifth active layer 15 are disposed separately.

Figure 8:
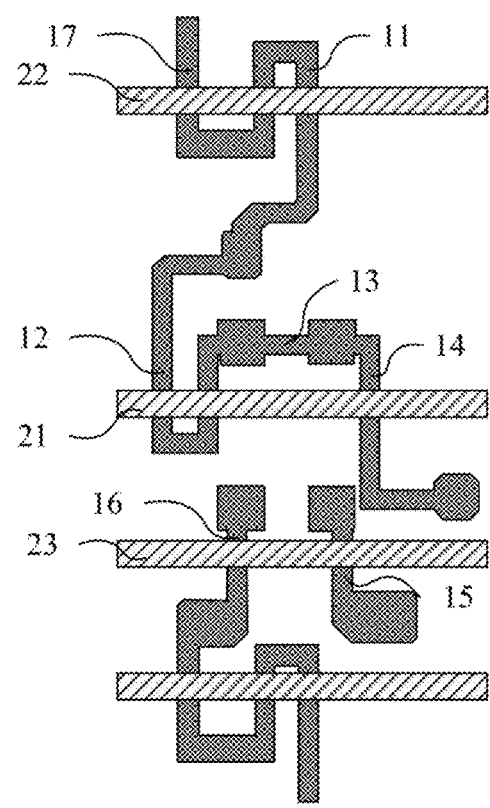
FIG. 8 is a schematic diagram of a patterned first conductive layer according to an exemplary embodiment of the present disclosure.

(12) Patterns are formed on the first conductive layer. In an exemplary embodiment, forming the patterns on the first conductive layer may include: depositing a second insulating film and a first metal film in sequence on the base on which the aforementioned patterns are formed, and patterning the first metal film through the patterning process to form the second insulating layer covering the patterns on the semiconductor layer and the patterns on the first conductive layer disposed on the second insulating layer. The patterns on the first conductive layer includes the first scanning signal line 21, the second scanning signal 22 and the light emitting control line 23, as shown in FIG. 8.

In an exemplary embodiment, the first scanning signal line 21, the second scanning signal line 22, and the light emitting control line 23 extend along the first direction X. The first scanning signal line 21 is arranged between the second scanning signal line 22 and the light emitting control line 23.

In an exemplary embodiment, the first scanning signal line 21, the second scanning signal line 22, and the light emitting control line 23 may be arranged at equal intervals or at unequal intervals, the intervals being the dimensions in the pixel column direction.

In an exemplary embodiment, an area in which the first scanning signal line 21 overlaps with the second active layer 12 serves as the gate electrode (dual-gate) of the second transistor T2, an area in which the first scanning signal line 21 overlaps with the fourth active layer 14 serves as the gate electrode of the fourth transistor T4, an area in which the second scanning signal line 22 overlaps with the first active layer 11 serves as the gate electrode (dual-gate) of the first transistor T1, an area in which the second scanning signal line 22 overlaps with the seventh active layer 17 serves as the gate electrode of the seventh transistor T7, an area in which the light emitting control line 23 overlaps with the fifth active layer 15 serves as the gate electrode of the fifth transistor T5, and an area in which the light emitting control line 23 overlaps with the sixth active layer 16 serves as the gate electrode of the sixth transistor T6.

In an exemplary embodiment, the first transistor T1, the second transistor T2, the fourth transistor T4, the fifth transistor T5, the sixth transistor T6 and the seventh transistor T7 are all switching transistors, and the active layers and the gate electrode of the switching transistors are separated by the second insulating layer only. The gate electrode of the third transistor T3 is not formed in the first conductive layer, that is, there is no overlapping area between the third active layer 13 and the first conductive layer.

Figure 9A:
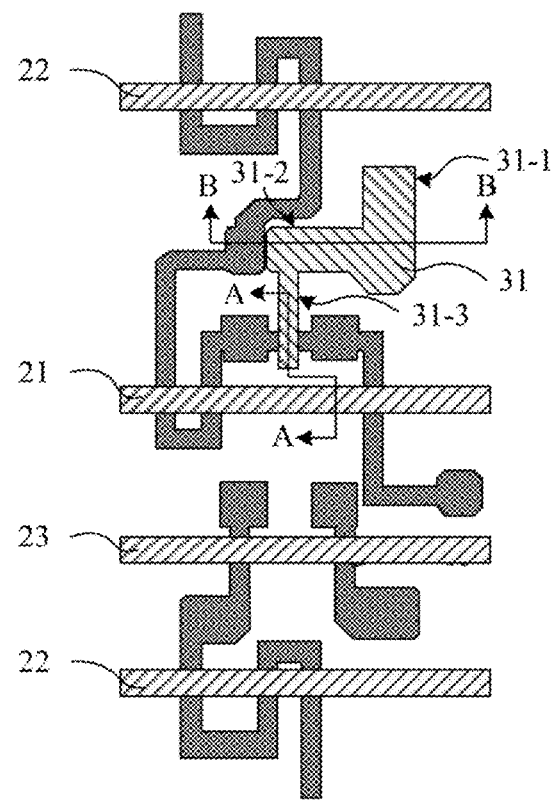
FIG. 9a is a schematic diagram of a patterned second conductive layer according to an exemplary embodiment of the present disclosure.
Figure 9B:
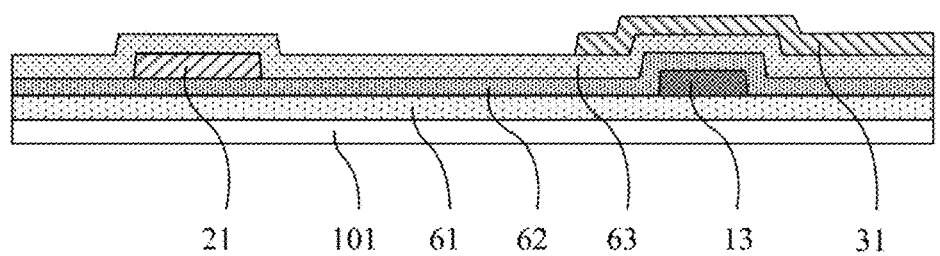
Figure 9C:
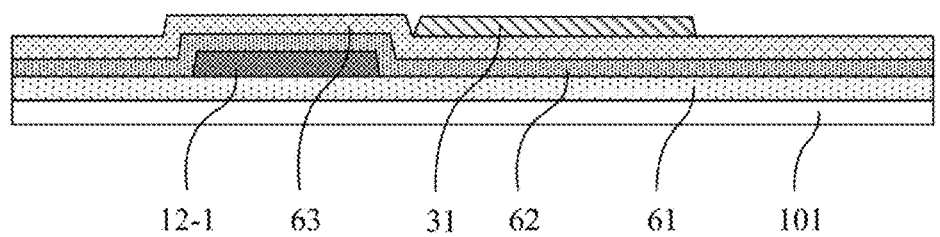

(13) Patterns are formed on the second conductive layer. In an exemplary embodiment, forming the patterns on the second conductive layer may include: depositing a third insulating film and a second metal film in sequence on the base on which the aforementioned patterns are formed, and patterning the second metal film through the patterning process to form the third insulating layer 63 covering the first conductive layer and the patterns on the second conductive layer disposed on the third insulating layer. The patterns on the second conductive layer includes the first polar plate 31 of the storage capacitor, as shown in FIGS. 9a, 9b and 9c. FIG. 9b is a sectional view taken along an A-A direction in FIG. 9a; and FIG. 9c is a sectional view taken along a B-B direction in FIG. 9a.

As shown in FIG. 9a, in an exemplary embodiment, the first polar plate 31 of the storage capacitor is disposed between the first scanning signal line 21 and the second scanning signal line 22, and serves as the gate electrode of the third transistor T3.

In an exemplary embodiment, the first polar plate 31 of the storage capacitor is in a zigzag shape and includes a first portion 31-1, a second portion 31-2 and a third portion 31-3 connected in sequence. The first portion 31-1 is strip-shaped, its first end approaches to the second scanning signal line 22, and its second end is connected to the first end of the second portion 31-2 after extending along the pixel column direction. There is no overlapping area between an orthogonal projection of the first portion 31-1 on the base and an orthogonal projection of the semiconductor layer on the base. The second portion 31-2 is strip-shaped, its first end is connected to the second end of the first portion 31-1, and its second end is connected to the first end of the third portion 31-3 after extending along the pixel row direction. There is no overlapping area between an orthogonal projection of the second portion 31-2 on the base and the orthogonal projection of the semiconductor layer on the base. The third portion 31-3 is strip-shaped, its first end is connected to the second end of the second portion 31-2, and its second end approaches to the first scanning signal line 21 after extending along the pixel row direction. There is no overlapping area between an orthogonal projection of the third portion 31-3 on the base and the orthogonal projection of the semiconductor layer on the base, the third portion 31-3 of the first polar plate in the overlapping area serves as the gate electrode of the third transistor T3, and the semiconductor layer in the overlapping area serves as the channel region of the third active layer.

As shown in FIGS. 9*b* and 9*c*, in a plane perpendicular to the base, a first insulating layer 61 is disposed on the base 101, and a semiconductor layer is disposed on the first insulating layer 61 and at least includes the third active layer 13 and the first electrode 12-1 of the second active layer. A second insulating layer 62 covers the semiconductor layer, and the first conductive layer is disposed on the second insulating layer 62 and at least includes the first scanning signal line 21. A third insulating layer 63 covers the first conductive layer, and the second conductive layer is disposed on the third insulating layer 63 and at least includes the first polar plate 31 of the storage capacitor.

In an exemplary embodiment, there is an overlapping area between an orthographic projection of the first polar plate 31 on the base and an orthographic projection of the third active layer 13 on the base, and the first polar plate 31 in the overlapping area serves as the gate electrode of the third transistor T3.

In an exemplary embodiment, after the patterns are formed on the second conductive layer, the semiconductor layer can be conductorized using the first conductive layer and the second conductive layer as barrier layers. Because there is only the first conductive layer but no second conductive layer above the channel regions of the active layers of the switching transistors and there is only the second conductive layer above the channel region of the active layer of the driving transistor, the semiconductor layers in areas sheltered by the first and second conductive layers form the channel regions of the first transistors T1 to the seventh transistors T7, while the semiconductor layers in an area not sheltered by the first conductive layer are conductorized, that is, both the first and second regions of the first to seventh active layers are conductorized.

High-resolution (PPI) display with finer picture quality and display quality has become a design trend. Because the pixel area of high-resolution display is smaller, various factors needs to be considered comprehensively to carry out arrangement of the pixel driving circuit in a limited space range. In the display substrate, both the active layers of the driving transistor and the active layer of the plurality of switching transistors are disposed on the semiconductor layer, both the gate electrode of the driving transistor and the gate electrodes of the plurality of switching transistors are arranged on the first conductive layer, and the gate electrodes and the active layers are separated by the second insulating layer only. Although the thin second insulating layer between the gate electrodes and the active layers can implement the fast switching function of the switching transistors, the area of the gate electrode of the driving transistor is larger, this is because the driving transistor needs to control the amplitude of a gate voltage Vgs to ensure a large number of gray scale ranges, and the gate electrode of the driving transistor with a smaller area will narrow a driving range of the driving transistor, it is difficult to ensure a large number of gray scales by controlling the amplitude of the gate voltage. The larger area of the gate electrode of the driving transistor is conducive to neither the arrangement of layout nor the improvement of resolution.

In an exemplary embodiment of the present disclosure, the gate electrodes of the switching transistors are arranged on the first conductive layer and the gate electrode of the driving transistor is arranged on the second conductive layer. Since the gate electrodes and the active layers of the plurality of switching transistors are separated by the second insulating layer only, the fast switching function of the switching transistors can be ensured. Because the gate electrode and the active layer of the driving transistor are separated by the second insulating layer and the third insulating layer, an insulating layer between the gate electrode and the active layer is composed of the second insulating layer and the third insulating layer, the thickness of the insulating layer between the gate electrode and the active layer is increased, thereby improving the amplitude of the controlled gate voltage of the driving transistor. As the area of the gate electrode of the driving transistor is reduced, the driving transistor can still be caused to ensure a large number of gray scale ranges. Compared with the scheme in which the gate electrode of the driving transistor is arranged on the first conductive layer, the scheme in which the gate electrode of the driving transistor is arranged on the second conductive layer effectively reduces the area of the gate electrode of the driving transistor, which is not only conducive to the arrangement of layout, but also can reduce the pixel area and improve the resolution.

In an exemplary embodiment, when both the gate electrode of the switching transistor and the gate electrode of the driving transistor are arranged on the first conductive layer, the area of the gate electrode of the driving transistor is about 10 to 35 times the area of the gate electrode of the switching transistor. In an exemplary embodiment of the present disclosure, when the gate electrode of the switching transistor is arranged on the first conductive layer and the gate electrode of the driving transistor is arranged on the second conductive layer, the area of the gate electrode of the driving transistor can be about 1 to 10 times the area of the gate electrode of the switching transistor, thereby effectively reducing the area of the gate electrode of the driving transistor.

Figure 10A:
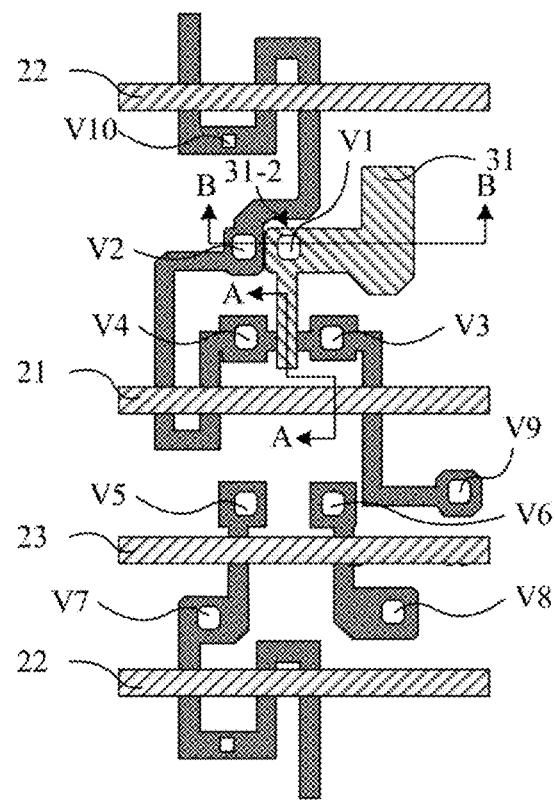
FIG. 10a is a schematic diagram of a patterned fourth insulating layer according to an exemplary embodiment of the present disclosure.
Figure 10B:
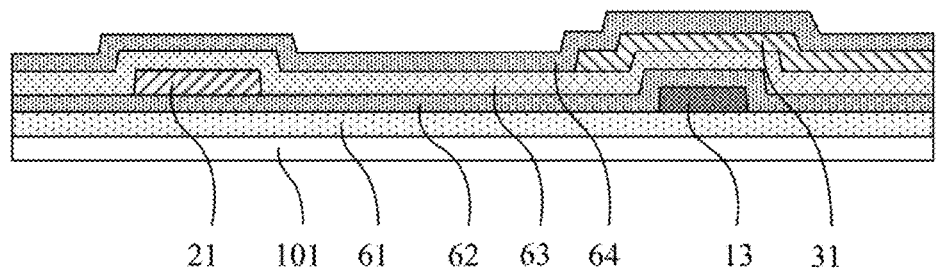
Figure 10C:
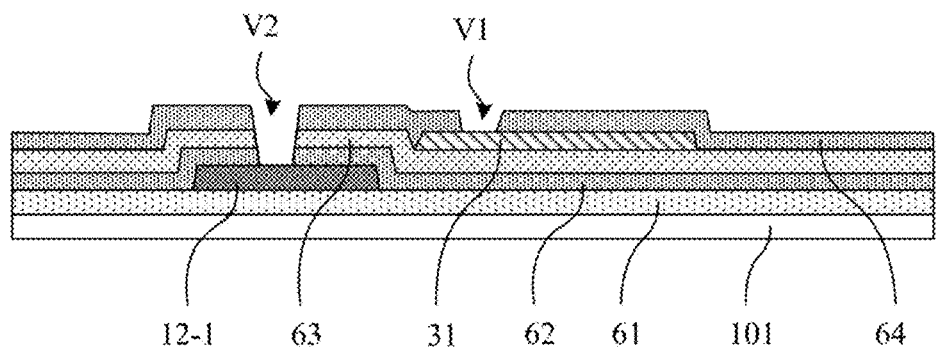

(14) Patterns are formed on the fourth insulating layer. In an exemplary embodiment, forming the patterns on the fourth insulation layer may include: depositing a fourth insulating film on the base on which the aforementioned patterns are formed, and patterning the fourth insulating film through the patterning process to form the fourth insulating layer covering the second conductive layer. A plurality of via holes are provided in the fourth insulating layer and includes at least a first via hole V1, a second via hole V2, a third via hole V3, a fourth via hole V4, a fifth via hole V5, a sixth via hole V6, a seventh via hole V7, an eighth via hole V8 and a ninth via hole V9, as shown in FIGS. 10a, 10b and 10c. FIG. 10b is a sectional view taken along an A-A direction in FIG. 10a; and FIG. 10c is a sectional view taken along a B-B direction in FIG. 10a.

As shown in FIG. 10a, in an exemplary embodiment, the first via hole V1 is located in the second portion 31-2 of the first polar plate 31, an orthogonal projection of the first via hole V1 on the base is within the range of the orthogonal projection of the second portion 31-2 of the first polar plate 31 on the base, and the fourth insulating layer in the first via holes V1 is etched away to expose the surface of the second portion 31-2 of the first polar plate 31. The first via hole V1 is arranged such that the first connecting electrode formed subsequently is connected to the first polar plate 31 through this via hole.

In an exemplary embodiment, the second via hole V2 is located in a second region of the first active layer, and the fourth, third and two insulating layers in the second via hole V2 are etched away to expose the surface of the second region of the first active layer. The second via hole V2 is arranged such that the first connecting electrode formed subsequently is connected to the first active layer through this via hole. Since the first connecting electrode formed subsequently is connected to the first polar plate 31 through the first via hole V1 and is connected to the second region of the first active layer through the second via hole V2, connections of the gate electrode (the first polar plate 31) of the third transistor T3 to the second electrode of the first transistor T1 and the first electrode of the second transistor T2 are implemented.

In an exemplary embodiment, the third via hole V3 is located in a first region of the third active layer, and the fourth, third and second insulating layers in the third via hole V3 are etched away to expose the surface of the first region of the third active layer. The third via hole V3 is arranged such that the third connecting electrode formed subsequently is connected to the third active layer through this via hole.

In an exemplary embodiment, the fourth via hole V4 is located in a second region of the third active layer, and the fourth, third and second insulating layers in the fourth via hole V4 are etched away to expose the surface of the second region of the third active layer. The fourth via hole V4 is arranged such that the second connecting electrode formed subsequently is connected to the third active layer through this via hole.

In an exemplary embodiment, the fifth via hole V5 is located in a first region of the sixth active layer, and the fourth, third and second insulating layers in the fifth via hole V5 are etched away to expose the surface of the first region of the sixth active layer. The fifth via hole V5 is arranged such that the second connecting electrode formed subsequently is connected to the sixth active layer through this via hole.

In an exemplary embodiment, the sixth via hole V6 is located in a second region of the fifth active layer, and the fourth, third and second insulating layers in the sixth via hole V6 are etched away to expose the surface of the second region of the fifth active layer. The sixth via hole V6 is arranged such that the third connecting electrode formed subsequently is connected to the fifth active layer through this via hole.

In an exemplary embodiment, the seventh via hole V7 is located in a second region of the sixth active layer, and the fourth, third and second insulating layers in the seventh via hole V7 are etched away to expose the surface of the second region of the sixth active layer. The seventh via hole V7 is arranged such that the fourth connecting electrode formed subsequently is connected to the sixth active layer through this via hole.

In an exemplary embodiment, the eighth via hole V8 is located in a first region of the fifth active layer, and the fourth, third and second insulating layers in the eighth via hole V8 are etched away to expose the surface of the first region of the fifth active layer. The eighth via hole V8 is arranged such that the first power line formed subsequently is connected to the fifth active layer through this via hole.

In an exemplary embodiment, the ninth via hole V9 is located in a first region of the fourth active layer, and the fourth, third and second insulating layers in the ninth via hole V9 are etched away to expose the surface of the first region of the fourth active layer. The ninth via hole V9 is arranged such that the data signal line formed subsequently is connected to the fourth active layer through this via hole.

In an exemplary embodiment, the tenth via hole V10 is located in a first region of the first active layer, and the fourth, third and second insulating layers in the tenth via hole V10 are etched away to expose the surface of the first region of the first active layer. The tenth via hole V10 is arranged such that the initial signal line formed subsequently is connected to the first active layer through this via hole.

As shown in FIGS. 10b and 10c, in the plane perpendicular to the base, the fourth insulating layer 64 covers the second conductive layer, in which a plurality of via holes, which includes at least the first via hole V1 and the first via hole V2, is provided. The fourth insulating layer 64 in the first via hole V1 is etched to expose the surface of the first polar plate 31, and the fourth insulating layer 64, the third insulating layer 63 and the second insulating layer 62 in the second via V2 are etched to expose the surface of the first region 12-1 of the second active layer.

Figure 11A:
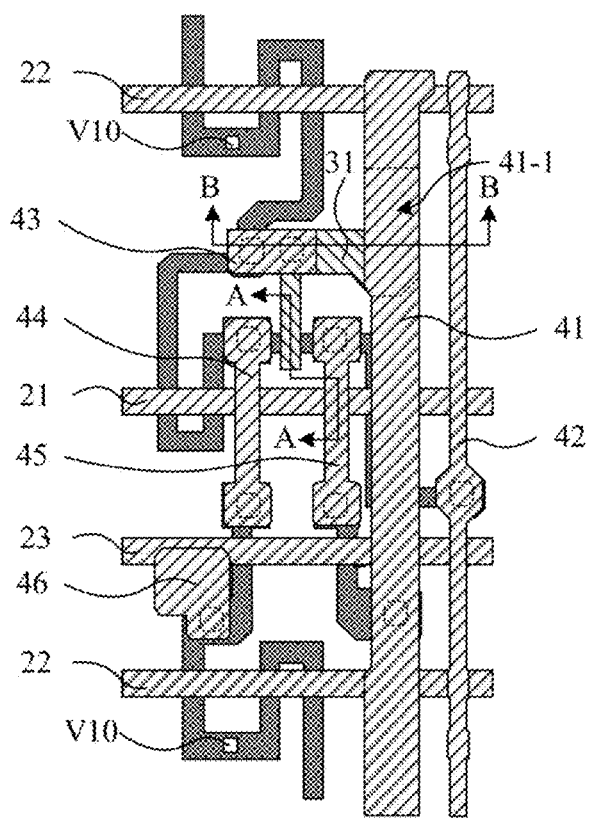
FIG. 11a is a schematic diagram of a patterned third conductive layer according to an exemplary embodiment of the present disclosure.
Figure 11B:
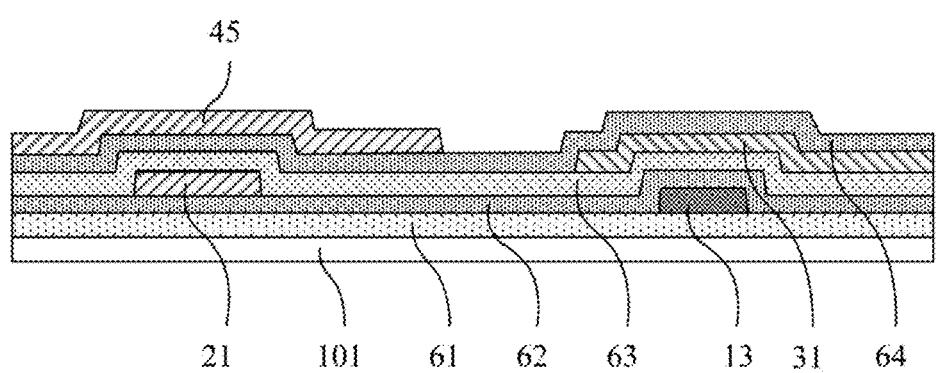
Figure 11C:
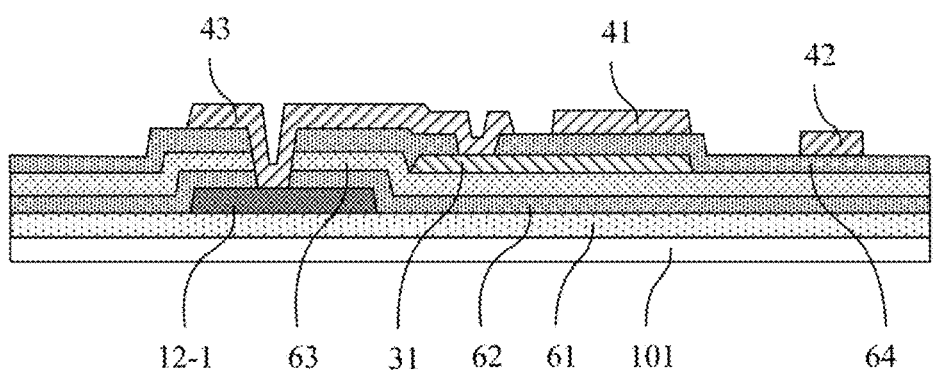

(15) Patterns are formed on the third conductive layer. In an exemplary embodiment, forming the patterns on the third conductive layer may include: depositing a third metal film on the base on which the aforementioned patterns are formed, and patterning the third metal film through the patterning process to form the third conductive layer disposed on the fourth insulating layer 64. The third conductive layer at least includes the first power line 41, the data signal line 42, the first connecting electrode 43, the second connecting electrode 44, the third connecting electrode 45 and the fourth connecting electrode 46, as shown in FIGS. 11a, 11b and 11c. FIG. 11b is a sectional view taken along an A-A direction in FIG. 11a; and FIG. 11c is a sectional view taken along a B-B direction in FIG. 11a.

In an exemplary embodiment, the first power line 41 extends along the pixel column direction and is connected to the first region of the fifth active layer through the eighth via hole V8, so that the first power line 41 transmits first power signals to the first electrode of the fifth transistor T5. There is an overlapping are between the orthogonal projection of the first power line 41 on the base and the orthogonal projection of the first portion 31-1 of the first polar plate 31 on the base, and the first power line 41 in the overlapping area serves as the second polar plate 41-1 of the storage capacitor, such that the first power line 41 and the second polar plate 41-1 of the storage capacitor have the same potential.

In an exemplary embodiment, the data signal line 42 extends along the pixel column direction and is connected to the first region of the fourth active layer through the ninth via hole V9, so that the data signal line 42 transmits data signals to the first electrode of the fourth transistor T4.

In an exemplary embodiment, a first end of the first connecting electrode 43 is connected to the second portion 31-2 of the first polar plate 31 through the first via hole V1, and its second end is connected to the second region of the first active layer through the second via hole V2. The connecting electrode 43 serves as the second electrode of the first transistor T1 and the first electrode of the second transistor T2. Since the first polar plate 31 serves as the gate electrode of the third transistor T3, the gate electrode of the third transistor T3, the first polar plate 31, the second electrode of the first transistor T1 and the first electrode of the second transistor T2 have the same potential.

In an exemplary embodiment, a first end of the second connecting electrode 44 is connected to the second region of the third active layer through the fourth via hole V4, and its second end is connected to the first region of the sixth active layer through the fifth via hole V5. The second connecting electrode 44 serves as the second electrode of the second transistor T2, the second electrode of the third transistor T3 and the first electrode of the sixth transistor T6, so that the second electrode of the second transistor T2, the second electrode of the third transistor T3 and the first electrode of the sixth transistor T6 have the same potential.

In an exemplary embodiment, a first end of the third connecting electrode 45 is connected to the first region of the third active layer through the third via hole V3, and its second end is connected to the second region of the fifth active layer through the sixth via hole V6. The third connecting electrode 45 serves as the first electrode of the third transistor T3, the second electrode of the fourth transistor T4 and the second electrode of the fifth transistor T5, so that the first electrode of the third transistor T3, the second electrode of the fourth transistor T4 and the second electrode of the fifth transistor T5 have the same potential.

In an exemplary embodiment, the fourth connecting electrode 46 is connected to the second region of the sixth active layer through the seventh via hole V7. The fourth connecting electrode 46 serves as the second electrode of the sixth transistor T6 and the second electrode of the seventh transistor T7, so that the second electrode of the sixth transistor T6 and the second electrode of the seventh transistor T7 have the same potential. In an exemplary embodiment, the fourth connecting electrode 46 is configured to be connected to an anode in a light emitting device formed subsequently.

In an exemplary embodiment, the first power lines 41 may be straight lines arranged at equal intervals or straight lines arranged at unequal intervals. The data signal lines 42 may be straight lines arranged at equal intervals or straight lines arranged at unequal intervals. The first power lines 41 and the data signal lines 42 are arranged at variable intervals, thereby not only facilitating the layout of pixel structures, but also reducing the parasitic capacitance.

As shown in FIGS. 11b and 11c, in the plane perpendicular to the base, the third conductive layer is disposed on the fourth insulating layer 64. The third conductive layer at least includes the first power line 41, the data signal line 42, the first connecting electrode 43 and the third connecting electrode 45, and the first connecting electrode 43 is connected to the first polar plate 31 through the first via hole V1.

Figure 12:
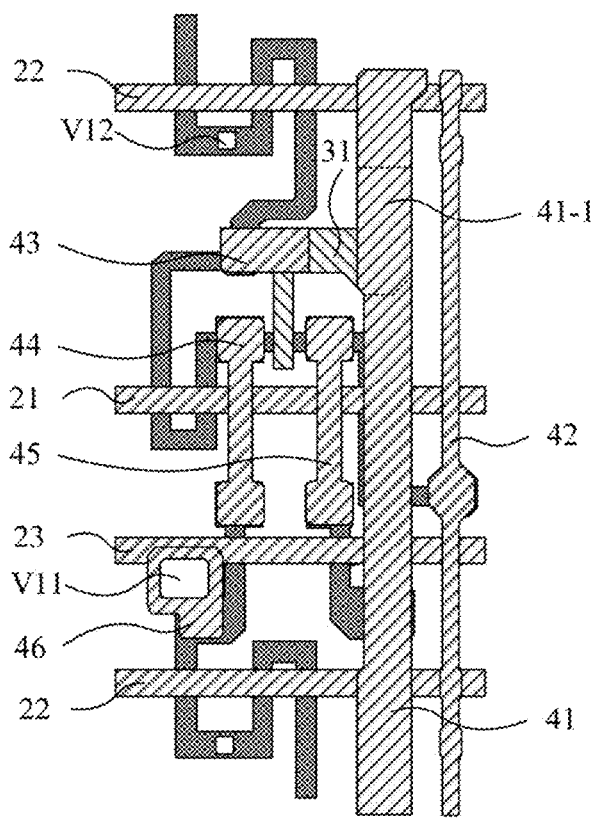
FIG. 12 is a schematic diagram of a patterned fifth insulating layer according to an exemplary embodiment of the present disclosure.

(16) Patterns are formed on the fifth insulating layer. In an exemplary embodiment, forming the patterns on the fifth insulating layer may include: coating a fifth insulating film on the base on which the aforementioned patterns are formed, and patterning the fifth insulating film through the patterning process to form the fifth insulating layer covering the third conductive layer. A plurality of via holes are provided in the fifth insulating layer, and at least include an eleventh via holes V11 and a twelfth via hole V12, as shown in FIG. 12.

In an exemplary embodiment, the eleventh via hole V11 is located in an area where the fourth connecting electrode 46 is located, and the fifth insulating layer in the eleventh via hole V11 is removed to expose the surface of the fourth connecting electrode 46. The eleventh via hole V11 is arranged such that the anode of the light emitting device formed subsequently is connected to the fourth connecting electrode 46 through this via hole.

In an exemplary embodiment, the twelfth via hole V12 is located in the first region of the first active layer, and the fifth insulating layer in the twelfth via hole V12 is removed and communicated with the tenth via hole V10, so that the twelfth via hole V12 and the tenth via hole V10 together expose the surface of the first region of the first active layer. The twelfth via hole V12 and the tenth via hole V10 are arranged such the initial signal line formed subsequently is connected to the first active layer through these via holes.

Figure 13:
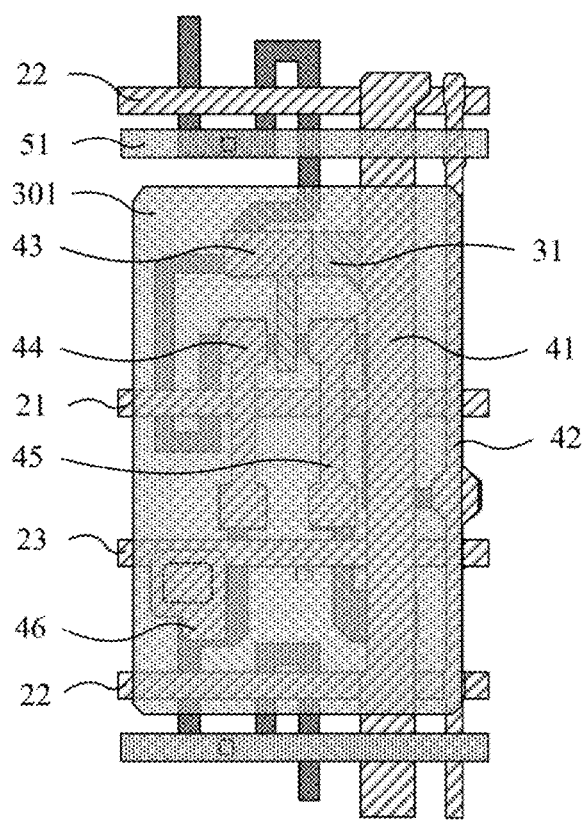
FIG. 13 is a schematic diagram of a patterned fourth conductive layer according to an exemplary embodiment of the present disclosure.

(17) Patterns are formed on the fourth conductive layer. In an exemplary embodiment, forming the patterns on the fourth conductive layer may include: depositing a fourth metal film on the base on which the aforementioned patterns are formed, and patterning the fourth metal film through the patterning process to form the fourth conductive layer disposed on the fifth insulating layer. The fourth conductive layer at least includes the initial signal line 51 and the anode 301 of the light emitting device, as shown in FIG. 13.

In an exemplary embodiment, the anode 301 of the light emitting device is connected to the fourth connecting electrode 46 through the eleventh via hole V11. Because the fourth connecting electrode 46 serves as the second electrode of the sixth transistor T6 and the second electrode of the seventh transistor T7, a connection between the anode 301 and the pixel driving circuit is implemented, such that the pixel driving circuit can drive the light emitting device to emit light.

In an exemplary embodiment, the initial signal line 51 extends along the pixel row direction and is arranged on a side of the second scanning signal line 22 close to the first scanning signal line 21. The initial signal line 51 is connected to the first region of the first active layer through the twelfth via hole V12 and the tenth via hole V10, so that the initial signal line 51 transmits initial signals to the first electrode of the first transistor T1 (which is also the first electrode of the seventh transistor T7).

In an exemplary embodiment, the initial signal lines 51 may be arranged at equal intervals or may be arranged at unequal intervals.

In an exemplary embodiment, a subsequent manufacturing process may include: coating a pixel defining film on the anode, and patterning the pixel defining film through the patterning process to form a pixel defining layer. A pixel opening exposing the anode is provided in the pixel defining layer of each sub-pixel. Subsequently, an organic light emitting layer is formed using an evaporation process, and a cathode is formed on the organic light emitting layer. Then, an encapsulation layer is formed and may include a first encapsulation layer, a second encapsulation layer and a third encapsulation layer that are stacked. The first encapsulation layer and the third encapsulation layer are made of inorganic materials, and the second encapsulation layer is made of organic materials. The second encapsulation layer is disposed between the first encapsulation layer and the third encapsulation layer, to ensure that external water vapor cannot enter the light emitting device.

In an exemplary embodiment, the base may be a flexible base or may be a rigid base. The rigid substrate may be, but is not limited to, one or more of glass and quartz. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible base may include a first flexible material layer, a first inorganic material layer, a semiconductor layer, a second flexible material layer and a second inorganic material layer which are stacked. The first flexible material layer and the second flexible material layer may be made of materials such as polyimide (PI), polyethylene terephthalate (PET) or a polymer soft film which is processed by surface treatment, and the first inorganic material layer and the second inorganic material layer may be made of materials such as silicon nitride (SiNx) or silicon oxide (SiOx), for improving the water and oxygen resistance of the base. The semiconductor layer may be made of materials such as amorphous silicon (a-si).

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure, such as Mo/Cu/Mo. The first conductive layer is referred to as a first gate metal (Gate1) layer, the second conductive layer is referred to as a second gate metal (Gate2) layer, the third conductive layer is referred to as a first source-drain metal (SD1) layer, and the fourth conductive layer is referred to as an anode layer. The first insulating layer, the second insulating layer, the third insulating layer and the fourth insulating layer may be made of any one or more of silicon oxide (SiOx), silicon nitride (SiNx) and silicon oxynitride (SiON), and may be a single layer, a multilayer or a composite layer. The first insulating layer is referred to as a buffer layer for improving the water and oxygen resistance of the base. The second and third insulating layers are referred to as gate insulating (GI) layers. The fourth insulating layer is referred to as an interlayer insulating (ILD) layer. The fifth insulating layer may be made of organic materials and is referred to as a flat layer. The semiconductor layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the present disclosure is applicable to transistors that are manufactured based on oxide technology, silicon technology or organic technology. The pixel defining layer may be made of polyimide, acrylic or polyethylene terephthalate. The cathode may be made of any one or more of magnesium (Mg), silver (Ag), aluminum (Al), copper (Cu) and lithium (Li), or an alloy of any one or more of the above metals.

In an exemplary embodiment, the thickness of the first insulating layer is 3000 to 5000 angstroms, the thickness of the second insulating layer is 1000 to 2000 angstroms, the thickness of the third insulating layer is 4500 to 7000 angstroms, the thickness of the fourth insulating layer is 3000 to 5000 angstroms, and the thickness of the fifth insulating layer is 3000 to 5000 angstroms.

It can be seen from the structure and manufacturing process of the display substrate described above that in the display substrate provided by the embodiments of the present disclosure, by arranging the gate electrodes of the switching transistors and the gate electrode of the driving transistor on different conductive layers, the thickness of the insulating layer between the gate electrode and the active layer of the driving transistor is effectively increased, thereby not only ensuring the fast switching characteristic of the switching transistors, but also improving the driving capability of the driving transistor. On the premise of ensuring that the driving transistor drives a large number of gray scale ranges, the area of the gate electrode of the driving transistor can be reduced effectively, which not only is conducive to the arrangement of layout, but also can reduce the pixel area, thereby improving the resolution of the display substrate and improving the display effect. The manufacturing process according to the present disclosure can be compatible well with the existing manufacturing process, be simple to implement, and be easy to carry out, such that the production efficiency is high, the production cost is low and the yield rate is high.

Figure 14:
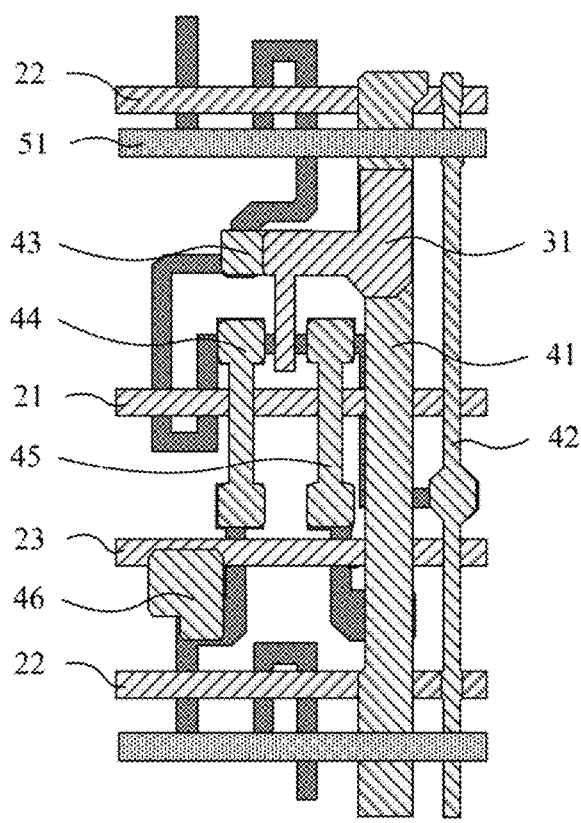
FIG. 14 is a schematic structure diagram of another display substrate according to an exemplary embodiment of the present disclosure.

FIG. 14 is a schematic structure diagram of another display substrate according to an exemplary embodiment of the present disclosure, which illustrates a planar structure of one sub-pixel. As shown in FIG. 14, in a plane parallel to the display substrate, a first scanning signal line 21, a second scanning signal line 22, a light emitting control line 23, an initial signal line 51, a first power line 41, a data signal line 42, a pixel driving circuit and a light emitting device are arranged in a sub-pixel of the display substrate. The pixel driving circuit may include a driving transistor, a plurality of switching transistors and a storage capacitor, each transistor including an active layer, a gate electrode, a first electrode and a second electrode, and the storage capacitor including a first polar plate 31 and a second polar plate 41-1.

In a plane perpendicular to the display substrate, the display substrate may include a semiconductor layer, a first conductive layer, a second conductive layer, a third conductive layer and a fourth conductive layer which are arranged sequentially on the base. In an exemplary embodiment, the semiconductor layer may include the active layer of the driving transistor and the active layers of the plurality of switching transistors, the first conductive layer may include the first scanning signal line 21, the second scanning signal line 22, the light emitting control line 23 and the gate electrodes of the plurality of switching transistors, and the second conductive layer may include the first power line 41, the data signal line 42, a first connecting electrode 43, a second connecting electrode 44, a third connecting electrode 45 and a fourth connecting electrode 46. A portion of the first power line 41 serves as the second polar plate 41-1 of the storage capacitor, the third conductive layer may include the first polar plate 31 of the storage capacitor, which serves as the gate electrode of the driving transistor, and the fourth conductive layer may include the initial signal line 51 and an anode of the light emitting device.

In an exemplary embodiment, the display substrate may further include a first insulating layer, a second insulating layer, a third insulating layer, a fourth insulating layer and a fifth insulating layer. The first insulating layer is disposed between the base and the semiconductor layer, the second insulating layer is disposed between the semiconductor layer and the first conductive layer, the fourth insulating layer is disposed between the first and second conductive layers, the third insulating layer is disposed between the second and third conductive layers, and the fifth insulating layer is arranged between the third and fourth conductive layers.

Compared with the structure of the display substrate shown in FIG. 6, in the structure of the display substrate shown in FIG. 14, the first power line, the data signal line, etc., are arranged on the second conductive layer, the gate electrode of the third transistor is arranged on the third conductive layer, positions of the third insulating layer and the fourth insulating layer are interchanged, and the first insulating layer, the semiconductor layer, the second insulating layer, the first conductive layer, the fourth conductive layer and the fifth insulating layer are basically the same in structure.

In an exemplary embodiment, the plurality of transistors of the pixel driving circuit may include a first transistor, a second transistor, a third transistor, a fourth transistor, a fifth transistor, a sixth transistor and a seventh transistor. The third transistor is a driving transistor, and other transistors are switching transistors.

In an exemplary embodiment, the first connecting electrode 43 serves as the second electrode of the first transistor T1 and the first electrode of the second transistor T2, the second connecting electrode 44 serves as the second electrode of the second transistor T2, the second electrode of the third transistor T3 and the first electrode of the sixth transistor T6, the third connecting electrode 45 serves as the first electrode of the third transistor T3, the second electrode of the fourth transistor T4 and the second electrode of the fifth transistor T5, and the fourth connecting electrode 46 serves as the second electrode of the sixth transistor T6 and the second electrode of the seventh transistor T7.

In display substrate provided by the exemplary embodiment of the present disclosure, by arranging the gate electrodes of the switching transistors on the first conductive layer and arranging the gate electrode of the driving transistor on the third conductive layer, not only the fast switching function of the switching transistors is ensured, but also the amplitude of the controlled gate voltage of the driving transistor is improved, thereby effectively reducing the area of the gate electrode of the driving transistor, which not only is conducive to the arrangement of layout, but also can reduce the pixel area and improve the resolution.

In an exemplary embodiment, when both the gate electrode of the switching transistor and the gate electrode of the driving transistor are arranged on the first conductive layer, the area of the gate electrode of the driving transistor is about 2 to 3 times the area of the gate electrode of the switching transistor. In an exemplary embodiment, when the gate electrode of the switching transistor is arranged on the first conductive layer, and the gate electrode of the driving transistor is arranged on the third conductive layer, the area of the gate electrode of the driving transistor is about 1 to 1.5 times the area of the gate electrode of the switching transistor.

In an exemplary embodiment, the process of manufacturing the display substrate according to the present embodiment may include the following operations.

(21) Patterns are formed on the semiconductor layer. In an exemplary embodiment, the process of forming the patterns on the semiconductor layer and the structure of the semiconductor layer are the same as those described in step (11), and will not be repeated herein.

(22) Patterns are formed on the first conductive layer. In an exemplary embodiment, the process of forming the patterns on the first conductive layer and the structure of the first conductive layer are the same as those described in step (12), and will not be repeated herein.

Figure 15:
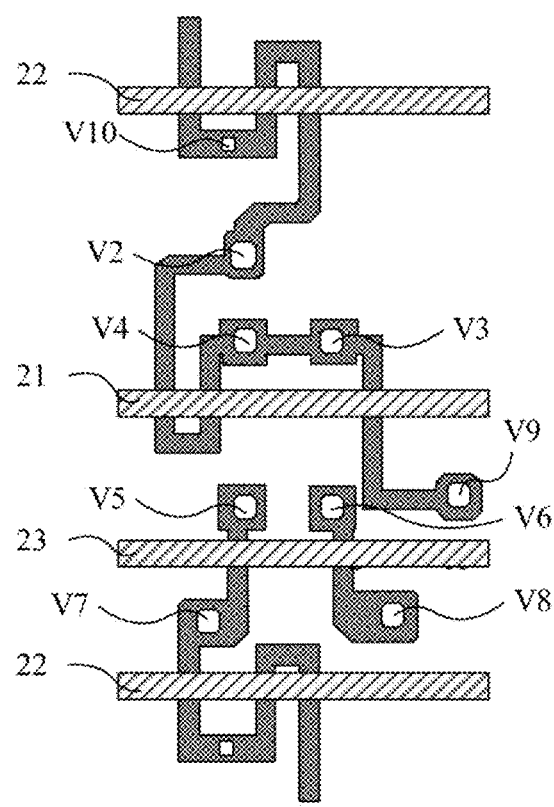
FIG. 15 is a schematic diagram of another patterned fourth insulating layer according to an exemplary embodiment of the present disclosure.

(23) Patterns are formed on the fourth insulating layer. In an exemplary embodiment, forming the patterns on the fourth insulation layer may include: depositing a fourth insulating film on the base on which the aforementioned patterns are formed, and patterning the fourth insulating film through the patterning process to form the fourth insulating layer covering the first conductive layer. A plurality of via holes are provided in the fourth insulating layer and at least includes a second via hole V2, a third via hole V3, a fourth via hole V4, a fifth via hole V5, a sixth via hole V6, a seventh via hole V7, an eighth via hole V8 and a ninth via hole V9, as shown in FIG. 15. In an exemplary embodiment, the fourth insulating layer is referred to as an interlayer insulating (ILD) layer.

In an exemplary embodiment, the second via hole V2 is located in a second portion of the first polar plate, and the fourth and second insulating layers in the second via holes V2 is etched away to expose the surface of the second portion of the first active layer. The second via hole V2 is arranged such that the first connecting electrode formed subsequently is connected to the first active layer through this via hole.

In an exemplary embodiment, the third via hole V3 is located in a first region of a third active layer, and the fourth and second insulating layers in the third via hole V3 are etched away to expose the surface of the first region of the third active layer. The third via hole V3 is arranged such that the third connecting electrode formed subsequently is connected to the third active layer through this via hole.

In an exemplary embodiment, the fourth via hole V4 is located in a second region of the third active layer, and the fourth and second insulating layers in the fourth via hole V4 are etched away to expose the surface of the second region of the third active layer. The fourth via hole V4 is arranged such that the second connecting electrode formed subsequently is connected to the third active layer through this via hole.

In an exemplary embodiment, the fifth via hole V5 is located in a second region of a sixth active layer, and the fourth and second insulating layers in the fifth via hole V5 are etched away to expose the surface of the first region of the sixth active layer. The fifth via hole V5 is arranged such that the second connecting electrode formed subsequently is connected to the sixth active layer through this via hole.

In an exemplary embodiment, the sixth via hole V6 is located in a second region of the sixth active layer, and the fourth and second insulating layers in the sixth via hole V6 are etched away to expose the surface of the second region of the fifth active layer. The sixth via hole V6 is arranged such that the third connecting electrode formed subsequently is connected to the fifth active layer through this via hole.

In an exemplary embodiment, the seventh via hole V7 is located in a second region of the sixth active layer, and the fourth and second insulating layers in the seventh via hole V7 are etched away to expose the surface of the second region of the sixth active layer. The seventh via hole V7 is arranged such that the fourth connecting electrode formed subsequently is connected to the sixth active layer through this via hole.

In an exemplary embodiment, the eighth via hole V8 is located in a first region of the fifth active layer, and the fourth and second insulating layers in the eighth via hole V8 are etched away to expose the surface of the first region of the fifth active layer. The eighth via hole V8 is arranged such that the first power line formed subsequently is connected to the fifth active layer through this via hole.

In an exemplary embodiment, the ninth via hole V9 is located in a first region of the fourth active layer, and the fourth and second insulating layers in the ninth via hole V9 are etched away to expose the surface of the first region of the fourth active layer. The ninth via hole V9 is arranged such that the data signal line formed subsequently is connected to the fourth active layer through this via hole.

In an exemplary embodiment, the tenth via hole V10 is located in a first region of the first active layer, and the fourth and second insulating layers in the tenth via hole V10 are etched away to expose the surface of the first region of the first active layer. The tenth via hole V10 is arranged such that the initial signal line formed subsequently is connected to the first active layer through this via hole.

Figure 16:
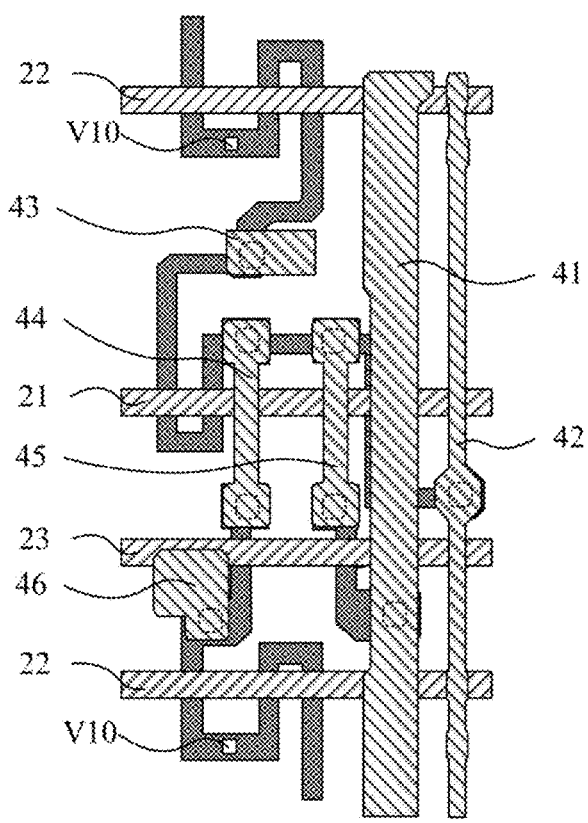
FIG. 16 is a schematic diagram of another patterned third conductive layer according to an exemplary embodiment of the present disclosure.

(24) Patterns are formed on the second conductive layer. In an exemplary embodiment, forming the patterns on the second conductive layer may include: depositing a second metal film on the base on which the aforementioned patterns are formed, and patterning the second metal film through the patterning process to form the second conductive layer disposed on the fourth insulating layer. The second conductive layer at least includes the first power line 41, the data signal line 42, the first connecting electrode 43, the second connecting electrode 44, the third connecting electrode 45 and the fourth connecting electrode 46, as shown in FIG. 16. In an exemplary embodiment, the second conductive layer is referred to as a second source-drain metal (SD1) layer.

In an exemplary embodiment, the first power line 41 extends along the pixel column direction and is connected to the first region of the fifth active layer through the eighth via hole V8, so that the first power line 41 transmits first power signals to the first electrode of the fifth transistor T5.

In an exemplary embodiment, the data signal line 42 extends along the pixel column direction and is connected to the first region of the fourth active layer through the ninth via hole V9, so that the data signal line 42 transmits data signals to the first electrode of the fourth transistor T4.

In an exemplary embodiment, the first connecting electrode 43 is connected to a second region of the first active layer through the second via hole V2. The connecting electrode 43 serves as the second electrode of the first transistor T1 and the first electrode of the second transistor T2.

In an exemplary embodiment, a first end of the second connecting electrode 44 is connected to the second region of the third active layer through the fourth via hole V4, and its second end is connected to the first region of the sixth active layer through the fifth via hole V5. The second connecting electrode 44 serves as the second electrode of the second transistor T2, the second electrode of the third transistor T3 and the first electrode of the sixth transistor T6, so that the second electrode of the second transistor T2, the second electrode of the third transistor T3 and the first electrode of the sixth transistor T6 have the same potential.

In an exemplary embodiment, a first end of the third connecting electrode 45 is connected to the first region of the third active layer through the third via hole V3, and its second end is connected to the second region of the fifth active layer through the sixth via hole V6. The third connecting electrode 45 serves as the first electrode of the third transistor T3, the second electrode of the fourth transistor T4 and the second electrode of the fifth transistor T5, so that the first electrode of the third transistor T3, the second electrode of the fourth transistor T4 and the second electrode of the fifth transistor T5 have the same potential.

In an exemplary embodiment, the fourth connecting electrode 46 is connected to the second region of the sixth active layer through the via hole V7. The fourth connecting electrode 46 serves as the second electrode of the sixth transistor T6 and the second electrode of the seventh transistor T7, so that the second electrode of the sixth transistor T6 and the second electrode of the seventh transistor T7 have the same potential. In an exemplary embodiment, the fourth connecting electrode 46 is configured to be connected to an anode in a light emitting device formed subsequently.

Figure 17:
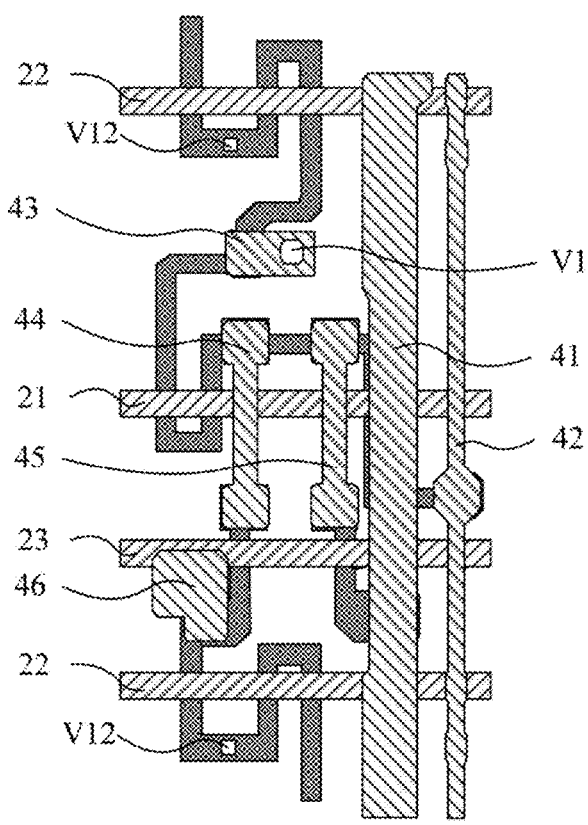
FIG. 17 is a schematic diagram of another patterned third insulating layer according to an exemplary embodiment of the present disclosure.

(25) Patterns are formed on the third insulating layer. In an exemplary embodiment, forming the patterns on the third insulating layer may include: depositing a third insulating film on the base on which the aforementioned patterns are formed, and patterning the third insulating film through the patterning process to form the third insulating layer covering the third conductive layer. A plurality of via holes are provided in the third insulating layer and at least includes a first via hole V1 and a twelfth via hole V12, as shown in FIG. 17. In an exemplary embodiment, the third insulating layer is referred to as a gate insulating (GI) layer.

In an exemplary embodiment, the first via hole V1 is located in an area where the first connecting electrode 43 is located, and an orthogonal projection of the first via hole V1 on the base is within the range of an orthogonal projection of the first connecting electrode 43 on the base, and the third insulating layer in the first via hole V1 is etched away to expose the surface of the first connecting electrode 43. The first via hole V1 is arranged such that the first polar plate 31 of the storage capacitor formed subsequently is connected to the first connecting electrode 43 through this via hole.

In an exemplary embodiment, the twelfth via hole V12 is located in the first region of the first active layer, and the third insulating layer in the twelfth via hole V12 is removed and communicated with the tenth via hole V10, so that the twelfth via hole V12 and the tenth via hole V10 together expose the surface of the first region of the first active layer. The twelfth via hole V12 and the tenth via hole V10 are arranged such that the initial signal line formed subsequently is connected to the first active layer through these via holes.

Figure 18:
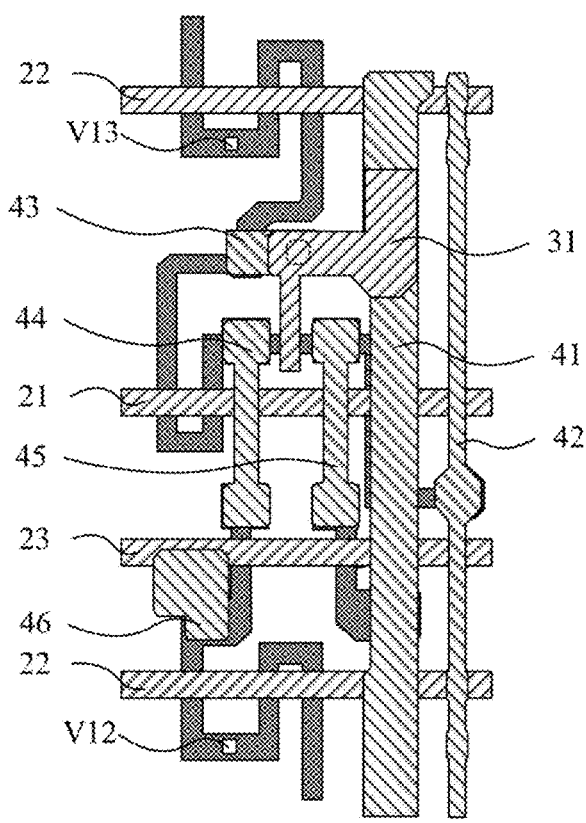
FIG. 18 is a schematic diagram of another patterned third conductive layer according to an exemplary embodiment of the present disclosure.

(26) Patterns are formed on the third conductive layer. In an exemplary embodiment, forming the patterns on the third conductive layer may include: depositing a third metal film, and patterning the third metal film through the patterning process to form the patterns on the third conductive layer on the third insulating layer. The patterns on the third conductive layer at least includes the first polar plate 31 of the storage capacitor, as shown in FIG. 18. In an exemplary embodiment, the third conductive layer is referred to as the second source-drain metal (Gate2) layer.

In an exemplary embodiment, the first polar plate 31 is connected to the first connecting electrode 43 through the first via hole V1, and the first polar plate 31 of the storage capacitor serves as the gate electrode of the third transistor T3. Since the first electrode plate 31 is connected to the first connecting electrode 43 through the first via hole V1 and the first connecting electrode 43 is connected to the second region of the first active layer through the second via hole V2, connections of the gate electrode (first electrode plate 31) of the third transistor T3 to the second electrode of the first transistor T1 and the first electrode of the second transistor T2 are implemented, and the gate electrode of the third transistor T3, the first polar plate 31, the second electrode of the first transistor T1 and the first electrode of the second transistor T2 have the same potential.

In an exemplary embodiment, there is an overlapping area between an orthographic projection of the first polar plate of the storage capacitor on the base and an orthographic projection of the third active layer on the base, and the first polar plate 31 in the overlapping area serves as the gate electrode of the third transistor T3. There is an overlapping area between the orthographic projection of the first polar plate of the storage capacitor on the base and an orthographic projection of the first power line 41 on the base, and the first power line 41 in the overlapping area serves as a second polar plate of the storage capacitor, such that the first power line 41 and the second polar plate of the storage capacitor have the same potential.

In an exemplary embodiment, the structure and shape of the first polar plate of the storage capacitor are basically the same as the structure and shape of the first polar plate in the previous embodiments, and will not be repeated herein.

In an exemplary embodiment of the present disclosure, the gate electrodes of the switching transistors are arranged on the first conductive layer and the gate electrode of the driving transistor is arranged on the third conductive layer. Since the gate electrodes and the active layers of the plurality of switching transistors are separated by the second insulating layer only, the fast switching function of the switching transistors can be ensured. Because the gate electrode and the active layer of the driving transistor are separated by the second insulating layer, the third insulating layer and the fourth insulating layer, and an insulating layer between the gate electrode and the active layer is thicker, the amplitude of the controlled gate voltage of the driving transistor is improved. A large number of gray scale ranges can still be ensured by the driving transistor as the area of the gate electrode of the driving transistor is reduced. Compared with the scheme in which the gate electrode of the driving transistor is arranged on the first conductive layer, the scheme in which the gate electrode of the driving transistor is arranged on the second conductive layer effectively reduces the area of the gate electrode of the driving transistor, which is not only conducive to the arrangement of layout, but also can reduce the pixel area and improve the resolution.

In an exemplary embodiment, when both the gate electrode of the switching transistor and the gate electrode of the driving transistor are arranged on the first conductive layer, the area of the gate electrode of the driving transistor is about 2 to 3 times the area of the gate electrode of the switching transistor. In an exemplary embodiment, when the gate electrode of the switching transistor is arranged on the first conductive layer, and the gate electrode of the driving transistor is arranged on the second conductive layer, the area of the gate electrode of the driving transistor is about 1 to 1.5 times the area of the gate electrode of the switching transistor.

Figure 19:
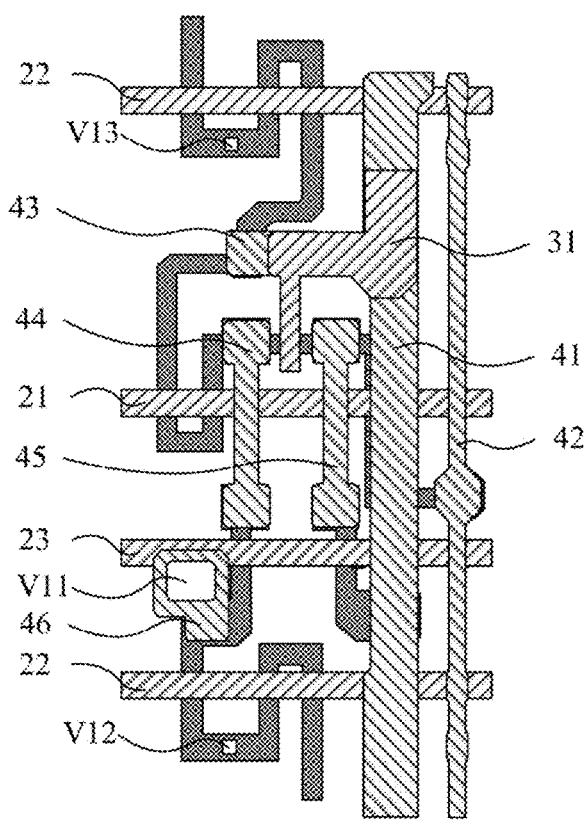
FIG. 19 is a schematic diagram of another patterned fifth insulating layer according to an exemplary embodiment of the present disclosure.

(27) Patterns are formed on the fifth insulating layer. In an exemplary embodiment, forming the patterns on the fifth insulating layer may include: coating a fifth insulating film on the base on which the aforementioned patterns are formed, and patterning the fifth insulating film through the patterning process to form the fifth insulating layer covering the third conductive layer. A plurality of via holes are provided in the fifth insulating layer, and at least include an eleventh via holes V11 and a thirteenth via hole V12, as shown in FIG. 19.

In an exemplary embodiment, the eleventh via hole V11 is located in an area where the fourth connecting electrode 46 is located, and the third insulating layer and the fifth insulating layer in the eleventh via hole V11 are removed to expose the surface of the fourth connecting electrode 46. The eleventh via hole V11 is arranged such that the anode of the light emitting device formed subsequently is connected to the fourth connecting electrode 46 through this via hole.

In an exemplary embodiment, the thirteenth via hole V13 is located in the first region of the first active layer, and the fifth insulating layer in the thirteenth via hole V13 is removed and communicated with the twelfth via hole V12, so that the thirteenth via hole V13, the twelfth via hole V12 and the tenth via hole V10 together expose the surface of the first region of the first active layer. The thirteenth via hole V13, the twelfth via hole V12 and the tenth via hole V10 are arranged such that the initial signal line formed subsequently is connected to the first active layer through these via holes.

Figure 20:
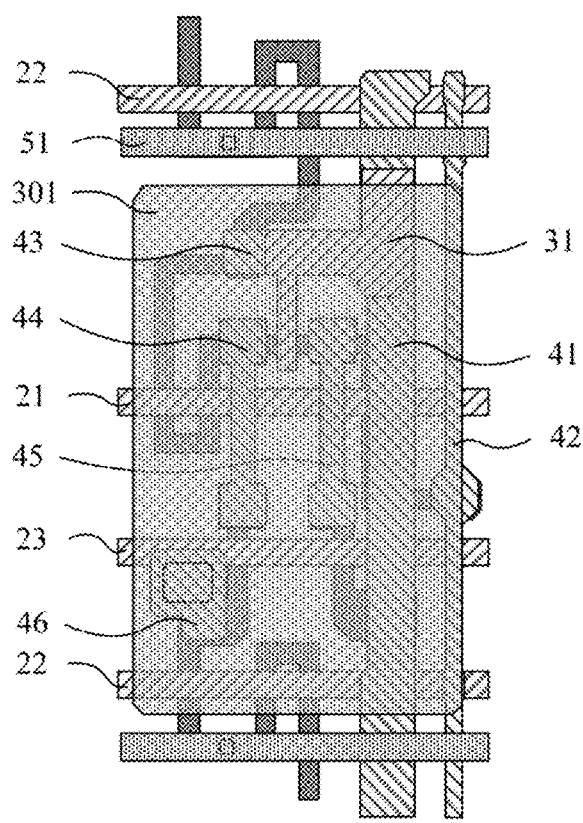
FIG. 20 is a schematic diagram of another patterned fourth conductive layer according to an exemplary embodiment of the present disclosure.

(28) Patterns are formed on a fourth conductive layer. In an exemplary embodiment, forming the patterns on the fourth conductive layer may include: depositing a fourth metal film on the base on which the aforementioned patterns are formed, and patterning the fourth metal film through the patterning process to form the fourth conductive layer disposed on the fifth insulating layer. The fourth conductive layer at least includes the initial signal line 51 and the anode 301 of the light emitting device, as shown in FIG. 20.

In an exemplary embodiment, the anode 301 of the light emitting device is connected to the fourth connecting electrode 46 through the eleventh via hole V11. Because the fourth connecting electrode 46 serves as the second electrode of the sixth transistor T6 and the second electrode of the seventh transistor T7, a connection between the anode 301 and the pixel driving circuit is implemented, such that the pixel driving circuit can drive the light emitting device to emit light.

In an exemplary embodiment, the initial signal line 51 extends along the pixel row direction and is arranged on a side of the second scanning signal line 22 close to the first scanning signal line 21. The initial signal line 51 is connected to the first region of the first active layer through the thirteenth via hole V13, the twelfth via hole V12 and the tenth via hole V10, so that the initial signal line 51 transmits initial signals to the first electrode of the first transistor T1 (which is also the first electrode of the seventh transistor T7).

Figure 21:
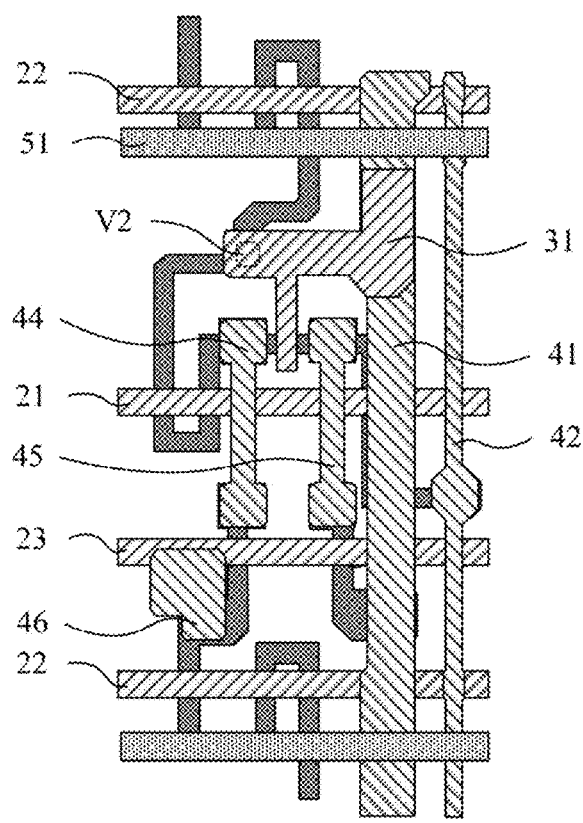
FIG. 21 is a schematic diagram of another display substrate according to an exemplary embodiment of the present disclosure.

FIG. 21 is a schematic diagram of another display substrate according to an exemplary embodiment of the present disclosure, which illustrates a planar structure of one subpixel. Compared with the structure of the display substrate shown in FIG. 14, in the structure of the display substrate shown in FIG. 21, the gate electrode of the third transistor is directly connected to the second electrode of the first transistor (which is also the first electrode of the second transistor) through the second via hole V2, and the first connecting electrode is not provided.

As shown in FIG. 21, in an exemplary embodiment, the process of manufacturing the display substrate according to the present embodiment may include the following operations.

(31) Patterns are formed on the semiconductor layer. In an exemplary embodiment, the process of forming the patterns on the semiconductor layer and the structure of the semiconductor layer are the same as those described in step (11), and will not be repeated herein.

(32) Patterns are formed on the first conductive layer. In an exemplary embodiment, the process of forming the patterns on the first conductive layer and the structure of the first conductive layer are the same as those described in step (12), and will not be repeated herein.

(33) Patterns are formed on the fourth insulating layer. A plurality of via holes are provided in the fourth insulating layer and at least includes a third via hole V3, a fourth via hole V4, a fifth via hole V5, a sixth via hole V6, a seventh via hole V7, an eighth via hole V8 and a ninth via hole V9.

(34) patterns are formed on the second conductive layer. The second conductive layer at least includes a first power line 41, a data signal line 42, a second connecting electrode 44, a third connecting electrode 45 and a fourth connecting electrode 46.

(35) Patterns are formed on the third insulating layer. A plurality of via holes are provided in the third insulating layer and at least includes a second via hole V2 and a twelfth via hole V12. The second via hole V2 is located in the second region of the first active layer, and the third insulating layer, the fourth insulating layer and the second insulating layer in the second via hole V2 are etched away to expose the surface of the second region of the first active layer. The second via hole V2 is arranged such that the first polar plate of the storage capacitor subsequently formed is connected to the first active layer through this via hole.

(36) Patterns are formed on the third conductive layer. The third conductive layer at least includes the first polar plate 31 of the storage capacitor. The polar plate 31 serves as the gate electrode of the third transistor T3, and is connected to the second region of the first active layer through the second via hole V2.

(37) The process of forming the patterns on the fifth insulating layer and the fourth conductive layer is the same as that in the foregoing exemplary embodiment.

The exemplary embodiment of the present disclosure effectively reduces the area of the gate electrode of the driving transistor, which not only is conducive to the arrangement of layout, but also can reduce the pixel area and improve the resolution.

The structure shown in the present disclosure and the manufacturing process thereof are merely an exemplary description. In an exemplary embodiment, corresponding structures may be changed and patterning processes may be added or reduced according to actual needs, which is not specifically limited herein in the present disclosure.

The present disclosure further provides a method for manufacturing a display substrate, to manufacture the display substrate according to the forgoing embodiments. In an exemplary embodiment, in a plane parallel to the display substrate, the display substrate includes a plurality of sub-pixels, at least one sub-pixel includes a pixel driving circuit and a light emitting device connected to the pixel driving circuit, the pixel driving circuit at least includes a storage capacitor, a driving transistor and at least one switching transistor; the method includes:

forming a semiconductor layer and a plurality of conductive layers on a base, a gate electrode of the driving transistor and a gate electrode of the at least one switching transistor being arranged on different conductive layers respectively.

In an exemplary embodiment, forming the semiconductor layer and the plurality of conductive layers on the base may include:

forming the semiconductor layer on the base;

forming a second insulating layer covering the semiconductor layer and a first conductive layer disposed on the second insulating layer, the first conductive layer including the gate electrode of the at least one switching transistor, forming a third insulating layer covering the first conductive layer and a second conductive layer disposed on the third insulating layer, the second conductive layer including the gate electrode of the driving transistor, forming a fourth insulating layer covering the second conductive layer and a third conductive layer disposed on the fourth insulating layer, the third conductive layer including a first power line and a first connecting electrode; a first via hole exposing the gate electrode of the driving transistor is provided in the fourth insulating layer, a second via hole exposing the active layer of the switching transistor is provided in the second, third and fourth insulating layers, and the first connecting electrode is connected to the gate electrode of the driving transistor through the first via hole and is connected to the active layer of the switching transistor through the second via hole; there is an overlapping area between an orthogonal projection of the gate electrode of the driving transistor on the base and an orthogonal projection of the first power line on the base, the gate electrode of the driving transistor in the overlapping area serves as a first polar plate of the storage capacitor, and the first power line in the overlapping area serves as a second polar plate of the storage capacitor.

In an exemplary embodiment, forming the semiconductor layer and the plurality of conductive layers on the base may include:

forming the semiconductor layer on the base;

forming a second insulating layer covering the semiconductor layer and a first conductive layer disposed on the second insulating layer, the first conductive layer including the gate electrode of the at least one switching transistor, forming a fourth insulating layer covering the first conductive layer and a second conductive layer disposed on the fourth insulating layer, wherein the second conductive layer includes a first power line and a first connecting electrode; a second via hole exposing the active layer of the switching transistor is provided in the second and fourth insulating layers, and the first connecting electrode is connected to the active layer of the switching transistor through the second via hole; and forming a third insulating layer covering the second conductive layer and a third conductive layer disposed on the third insulating layer, wherein the third conductive layer includes the gate electrode of the driving transistor; a first via hole exposing the first connecting electrode is provided in the third insulating layer, and the gate electrode of the driving transistor is connected to the first connecting electrode through the first via hole; there is an overlapping area between an orthogonal projection of the gate electrode of the driving transistor on the base and an orthogonal projection of the first power line on the base, the gate electrode of the driving transistor in the overlapping area serves as a first polar plate of the storage capacitor, and the first power line in the overlapping area serves as a second polar plate of the storage capacitor.

In an exemplary embodiment, forming the semiconductor layer and the plurality of conductive layers on the base may include:

forming the semiconductor layer on the base;

forming a second insulating layer covering the semiconductor layer and a first conductive layer disposed on the second insulating layer, the first conductive layer including the gate electrode of the at least one switching transistor, forming a fourth insulating layer covering the first conductive layer and a second conductive layer disposed on the fourth insulating layer, wherein the second conductive layer includes a first power line; and forming a third insulating layer covering the second conductive layer and a third conductive layer disposed on the third insulating layer, wherein the third conductive layer includes the gate electrode of the driving transistor, a second via hole exposing the active layer of the switching transistor is provided in the second, fourth and third insulating layers, and the gate electrode of the driving transistor is connected to the active layer of the switching transistor through the second via hole; there is an overlapping area between an orthogonal projection of the gate electrode of the driving transistor on the base and an orthogonal projection of the first power line on the base, the gate electrode of the driving transistor in the overlapping area serves as a first polar plate of the storage capacitor, and the first power line in the overlapping area serves as a second polar plate of the storage capacitor.

The implementation principles and implementation effects of the display substrates manufactured by the method for manufacturing a display substrate according to the present disclosure are similar and will not be repeated herein.

The present disclosure further provides a display device including the display substrate described above. The display device may be any product or component with a display function, such as a mobile phone, a tablet computer, a television, a display, a laptop computer, a digital photo frame, a navigator, etc., and the embodiments of the present invention are not limited thereto.

Although the embodiments disclosed in the present disclosure are described above, the described contents are only the embodiments for facilitating understanding of the present disclosure, and are not intended to limit the present disclosure. Any person skilled in the art to which the present disclosure pertains may make any modification and variation in forms and details of implementation without departing from the spirit and scope of the present disclosure, however, the patent protection scope of the present disclosure shall still be subject to the scope defined by the appended claims.

The invention claimed is:

1. A display substrate, wherein
in a plane parallel to the display substrate, the display substrate comprises a plurality of sub-pixels, at least one sub-pixel comprises a pixel driving circuit and a light emitting device connected to the pixel driving circuit, the pixel driving circuit at least comprises a storage capacitor and a plurality of transistors, the plurality of transistors at least comprises a driving transistor and at least one switching transistor of a dual-gate structure, the storage capacitor comprises a first polar plate and a second polar plate, the first plate is connected to a gate electrode of the driving transistor, the second polar plate is connected to a first power line, and the light emitting device at least comprises an anode; and
in a plane perpendicular to the display substrate, the display substrate comprises a plurality of conductive layers, the first polar plate and the gate electrode of the drive transistor are arranged in a same layer, the second polar plate and the first power line are arranged in a same layer, an orthogonal projection of the anode on the plane of the display substrate at least partially overlaps an orthogonal projection of the driving transistor on the plane of the display substrate, and two channels of the switching transistor of the dual-gate structure extend along a pixel row direction.

2. The display substrate according to claim 1, wherein the plurality of transistors at least comprises a first transistor, a second transistor, a third transistor, a fourth transistor, a fifth transistor, a sixth transistor, and a seventh transistor, the switching transistor of the dual-gate structure is the first transistor, and the driving transistor is the third transistor;
a gate electrode of the first transistor is connected to a second scanning signal line, a first electrode of the first transistor is connected to an initial signal line, a second electrode of the first transistor is connected to a first electrode of the second transistor;
a gate electrode of the second transistor is connected to a first scanning signal line, and a second electrode of the second transistor is connected to a second electrode of the third transistor;
a first electrode of the third transistor is connected to a second electrode of the fourth transistor and a second electrode of the fifth transistor;
a gate electrode of the fourth transistor is connected to the first scanning signal line, and a first electrode of the fourth transistor is connected with a data signal line;
a gate electrode of the fifth transistor is connected to a light emitting control line, and a first electrode of the fifth transistor is connected with the first power line;
a gate electrode of the sixth transistor is connected to the light emitting control line, a first electrode of the sixth transistor is connected to the second electrode of the third transistor, and a second electrode of the sixth transistor is connected with the anode of the light emitting device;
a gate electrode of the seventh transistor is connected to the first scanning signal line, a first electrode of the seventh transistor is connected to the initial signal line, and a second electrode of the seventh transistor is connected to the anode of the light emitting device.

3. The display substrate according to claim 2, wherein in the plane perpendicular to the display substrate, the display substrate further comprises a semiconductor layer disposed on a base, and active layers of the first transistor to the seventh transistor are arranged in the semiconductor layer;
the semiconductor layer comprises a first active layer of the first transistor, a second active layer of the second transistor, a third active layer of the third transistor, a fourth active layer of the fourth transistor, a fifth active layer of the fifth transistor, a sixth active layer of the sixth transistor and a seventh active layer of the seventh transistor; and
a second region of the first active layer and a first region of the second active layer are connected to each other, a second region of the second active layer and a second region of the third active layer are connected to each other, a first region of the third active layer and a second region of the fourth active layer are connected to each other, a second region of the sixth active layer and a second region of the seventh active layer are connected to each other.

4. The display substrate according to claim 3, wherein an area in which the first scanning signal line overlaps with the second active layer serves as the gate electrode of the second transistor of the dual-gate structure,
an area in which the first scanning signal line overlaps with the fourth active layer serves as the gate electrode of the fourth transistor,
an area in which the second scanning signal line overlaps with the first active layer serves as the gate electrode of the first transistor of dual-gate structure, an area in which the second scanning signal line overlaps with the seventh active layer serves as the gate electrode of the seventh transistor, an area in which the light emitting control line overlaps with the fifth active layer serves as the gate electrode of the fifth transistor, and an area in which the light emitting control line overlaps with the sixth active layer serves as the gate electrode of the sixth transistor.

5. The display substrate according to claim 3, wherein the first power line is connected to a first region of the fifth active layer through an eighth via hole, the data signal line is connected to a first region of the fourth active layer through a ninth via hole, and the initial signal line is connected to a first region of the first active layer and a first region of the seventh active layer through a tenth via hole and a twelfth via hole.

6. A display device, comprising the display substrate according to claim 1.

7. A method for manufacturing a display substrate, wherein in a plane parallel to the display substrate, the display substrate comprises a plurality of sub-pixels, at least one sub-pixel comprises a pixel driving circuit and a light emitting device connected to the pixel driving circuit, the pixel driving circuit at least comprises a storage capacitor and a plurality of transistors, the plurality of transistors at least comprises a driving transistor and at least one switching transistor of a dual-gate structure, the storage capacitor comprises a first polar plate and a second polar plate, the first polar plate is connected to a gate electrode of the driving transistor, the second polar plate is connected to a first power line, the light emitting device at least comprises an anode; the method comprises:

forming a plurality of conductive layers, wherein the first polar plate and the gate electrode of the drive transistor are arranged in a same layer, the second polar plate and the first power line are arranged in a same layer, an orthogonal projection of the anode on the plane of the display substrate at least partially overlaps an orthogonal projection of the driving transistor on the plane of the display substrate, and two channels of the switching transistor of the dual-gate structure extend along a pixel row direction.

8. The method according to claim 7, wherein the plurality of transistors at least comprises a first transistor, a second transistor, a third transistor, a fourth transistor, a fifth transistor, a sixth transistor, and a seventh transistor, the switching transistor of the dual-gate structure is the first transistor, and the driving transistor is the third transistor;

a gate electrode of the first transistor is connected to a second scanning signal line, a first electrode of the first transistor is connected to an initial signal line, a second electrode of the first transistor is connected to a first electrode of the second transistor and a gate electrode of the third transistor;

a gate electrode of the second transistor is connected to a first scanning signal line, a second electrode of the second transistor is connected to a second electrode of the third transistor;

a first electrode of the third transistor is connected to a second electrode of the fourth transistor and a second electrode of the fifth transistor;

a gate electrode of the fourth transistor is connected to the first scanning signal line, and a first electrode of the fourth transistor is connected with a data signal line;

a gate electrode of the fifth transistor is connected to a light emitting control line, and a first electrode of the fifth transistor is connected with the first power line;

a gate electrode of the sixth transistor is connected to the light emitting control line, a first electrode of the sixth transistor is connected to the second electrode of the third transistor, and a second electrode of the sixth transistor is connected with the anode of the light emitting device; and a gate electrode of the seventh transistor is connected to the first scanning signal line, a first electrode of the seventh transistor is connected to the initial signal line, and a second electrode of the seventh transistor is connected to the anode of the light emitting device.

* * * * *